(12) United States Patent
Nishi et al.

(10) Patent No.: US 7,868,324 B2
(45) Date of Patent: *Jan. 11, 2011

(54) LIGHT EMITTING DEVICE

(75) Inventors: Takeshi Nishi, Kanagawa (JP); Satoshi Seo, Kanagawa (JP)

(73) Assignee: Semiconductor Energy laboratory Co., Ltd. (JP)

( * ) Notice: Subject to any disclaimer, the term of this patent is extended or adjusted under 35 U.S.C. 154(b) by 171 days.

This patent is subject to a terminal disclaimer.

(21) Appl. No.: 12/111,586

(22) Filed: Apr. 29, 2008

(65) Prior Publication Data

US 2008/0278069 A1    Nov. 13, 2008

Related U.S. Application Data

(63) Continuation of application No. 11/600,266, filed on Nov. 15, 2006, now Pat. No. 7,372,076, which is a continuation of application No. 10/304,238, filed on Nov. 26, 2002, now Pat. No. 7,141,817.

(30) Foreign Application Priority Data

Nov. 30, 2001   (JP)   ............... 2001-367557

(51) Int. Cl.
    *H01L 51/00* (2006.01)
(52) U.S. Cl. .................. 257/40; 257/79; 257/89; 257/E51.001
(58) Field of Classification Search ............. 257/40, 257/79, 89
    See application file for complete search history.

(56) References Cited

U.S. PATENT DOCUMENTS

| | | | |
|---|---|---|---|
| 4,849,314 A | | 7/1989 | Blanchet-Fincher et al. |
| 5,616,287 A | * | 4/1997 | Finter et al. ............... 252/500 |
| 5,943,154 A | | 8/1999 | Nakayama |
| 5,998,803 A | | 12/1999 | Forrest et al. |

(Continued)

FOREIGN PATENT DOCUMENTS

CN      1279518 A      1/2001

(Continued)

OTHER PUBLICATIONS

Tang, C.W. et al, "Organic Electroluminescent Diodes," Applied Physics Letters, vol. 51, No. 12, Sep. 21, 1987, pp. 913-915.

(Continued)

*Primary Examiner*—Wai-Sing Louie
(74) *Attorney, Agent, or Firm*—Husch Blackwell LLP Welsh Katz

(57) ABSTRACT

By doping an organic compound functioning as an electron donor (hereinafter referred to as donor molecules) into an organic compound layer contacting a cathode, donor levels can be formed between respective LUMO (lowest unoccupied molecular orbital) levels between the cathode and the organic compound layer, and therefore electrons can be injected from the cathode, and transmission of the injected electrons can be performed with good efficiency. Further, there are no problems such as excessive energy loss, deterioration of the organic compound layer itself, and the like accompanying electron movement, and therefore an increase in the electron injecting characteristics and a decrease in the driver voltage can both be achieved without depending on the work function of the cathode material.

22 Claims, 19 Drawing Sheets

U.S. PATENT DOCUMENTS

| | | | |
|---|---|---|---|
| 6,013,384 | A | 1/2000 | Kido et al. |
| 6,097,147 | A | 8/2000 | Baldo et al. |
| 6,380,687 | B1 | 4/2002 | Yamazaki |
| 6,501,466 | B1 | 12/2002 | Yamagishi et al. |
| 6,538,390 | B2 | 3/2003 | Fujita et al. |
| 6,552,496 | B2 | 4/2003 | Yamazaki |
| 6,566,807 | B1 | 5/2003 | Fujita et al. |
| 6,580,212 | B2 | 6/2003 | Friend |
| 6,589,673 | B1 | 7/2003 | Kido et al. |
| 6,597,111 | B2 | 7/2003 | Silvernail et al. |
| 6,639,357 | B1 | 10/2003 | Parthasarathy et al. |
| 6,689,491 | B1 | 2/2004 | Nii et al. |
| 6,750,609 | B2 | 6/2004 | Aziz et al. |
| 6,765,549 | B1 | 7/2004 | Yamazaki et al. |
| 6,774,573 | B2 | 8/2004 | Yamazaki |
| 7,074,500 | B2 | 7/2006 | Pfeiffer et al. |
| 7,141,817 | B2 * | 11/2006 | Nishi et al. ................ 257/40 |
| 7,256,422 | B2 | 8/2007 | Yamazaki |
| 2002/0113545 | A1 * | 8/2002 | Adachi et al. ............ 313/504 |
| 2002/0186214 | A1 | 12/2002 | Siwinski |
| 2003/0062523 | A1 | 4/2003 | Bae et al. |

FOREIGN PATENT DOCUMENTS

| | | | |
|---|---|---|---|
| EP | 0 855 848 | A2 | 7/1998 |
| EP | 1 017 118 | A2 | 7/2000 |
| EP | 1 065 723 | A2 | 1/2001 |
| EP | 1 089 361 | A2 | 4/2001 |
| EP | 1 089 290 | A2 | 5/2001 |
| JP | 2-213088 | | 8/1990 |
| JP | 9-59614 | | 3/1997 |
| JP | 10-270171 | | 10/1998 |
| JP | 2000-196140 | | 7/2000 |
| JP | 2001-102175 | | 4/2001 |
| JP | 2001-222256 | | 8/2001 |
| JP | 2001-244079 | | 9/2001 |
| JP | 2003-86381 | | 3/2003 |

OTHER PUBLICATIONS

Hung, L.S. et al, "Enchanced Electron Injection in Organic Electroluminescence Devices Using an Al/LiF Electrode," Applied Physics Letters, vol. 70, No. 2, Jan. 13, 1997, pp. 512-154.

Blochwitz, J. et al, "Low Voltage Organic Light Emitting Diodes Featuring Doped Phthalocyanine as Hole Transport Material," Applied Physics Letters, vol. 73, No. 6, Aug. 10, 1998, pp. 729-731.

"High Luminance Thin Film EL element Using Li Alloy Cathode," Partial translation of 51$^{st}$ Japanese Society of Applied Physics Annual Meeting, Digest 28a-PB-4, p. 1040.

Office Action re Japanese Patent Application No. JP 2002-343617, dated Jan. 6, 2005, (with partial English translation).

Office Action re Chinese patent application No. CN02154825.0, dated Aug. 3, 2007 (with English translation).

* cited by examiner

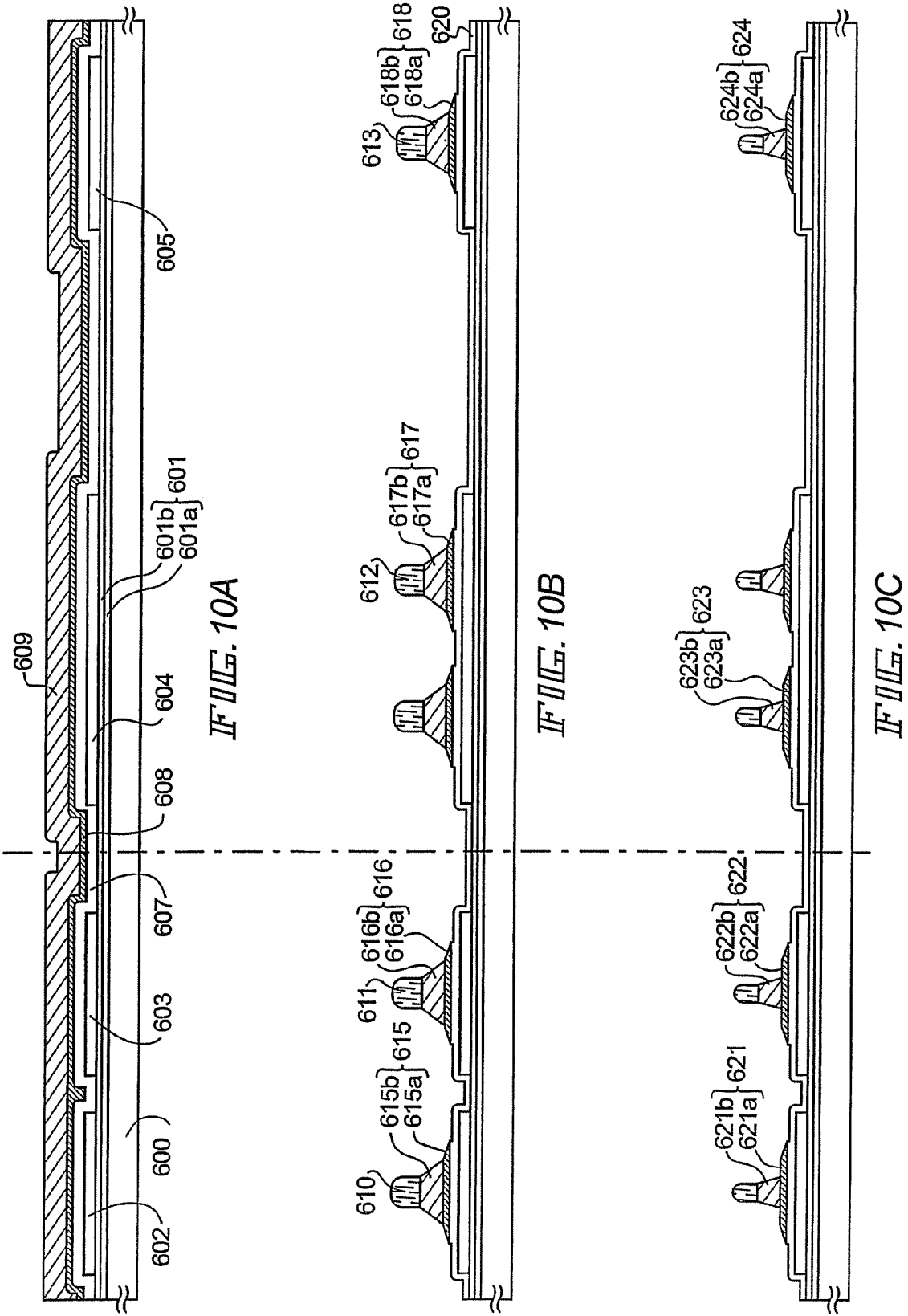

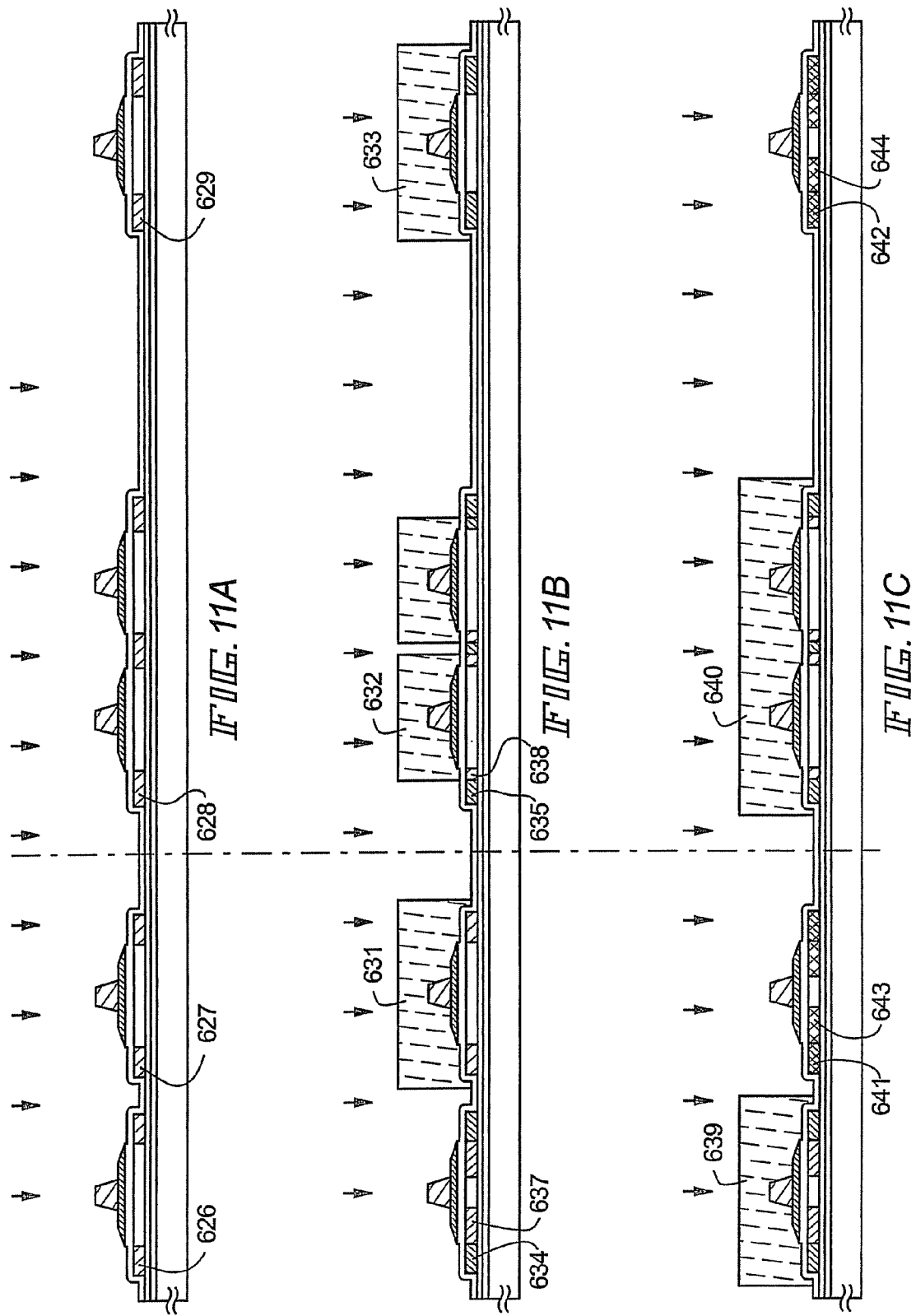

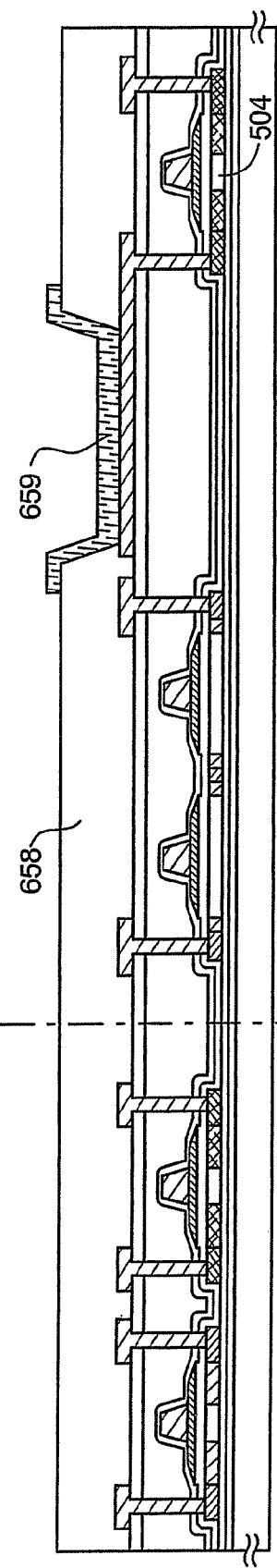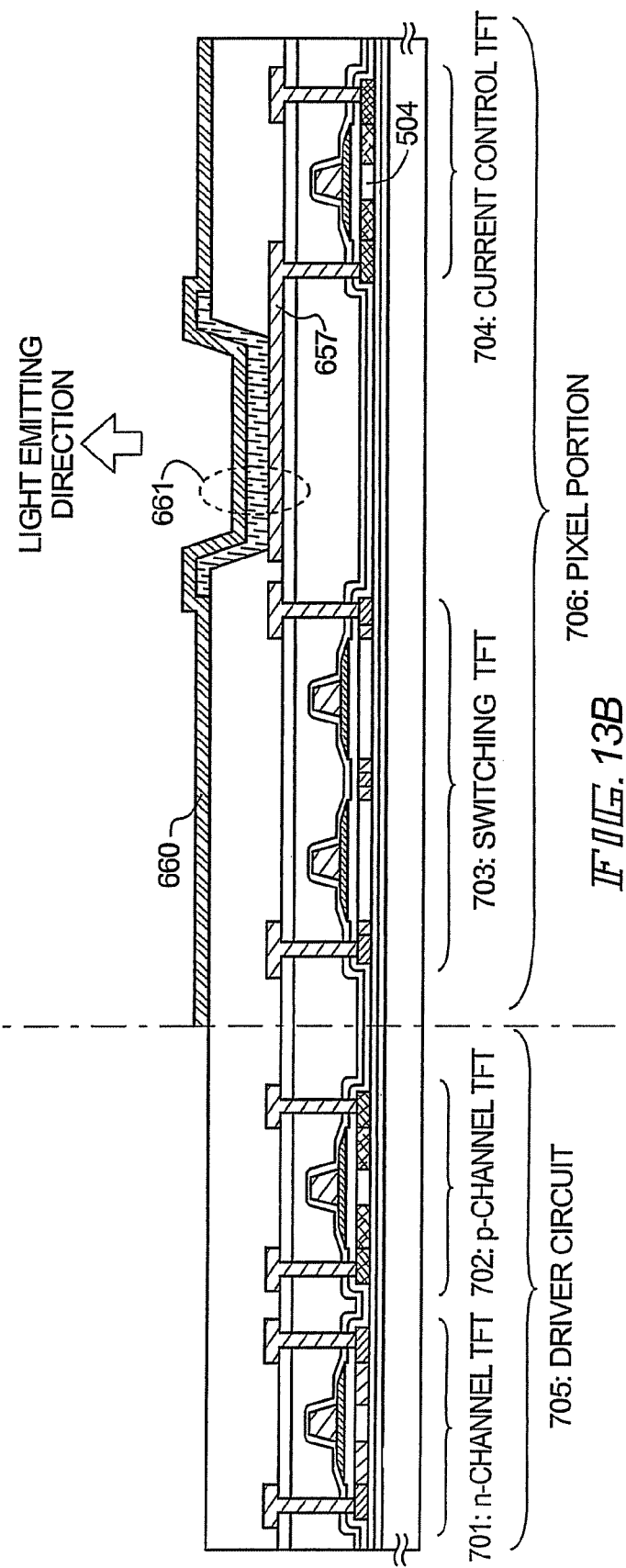

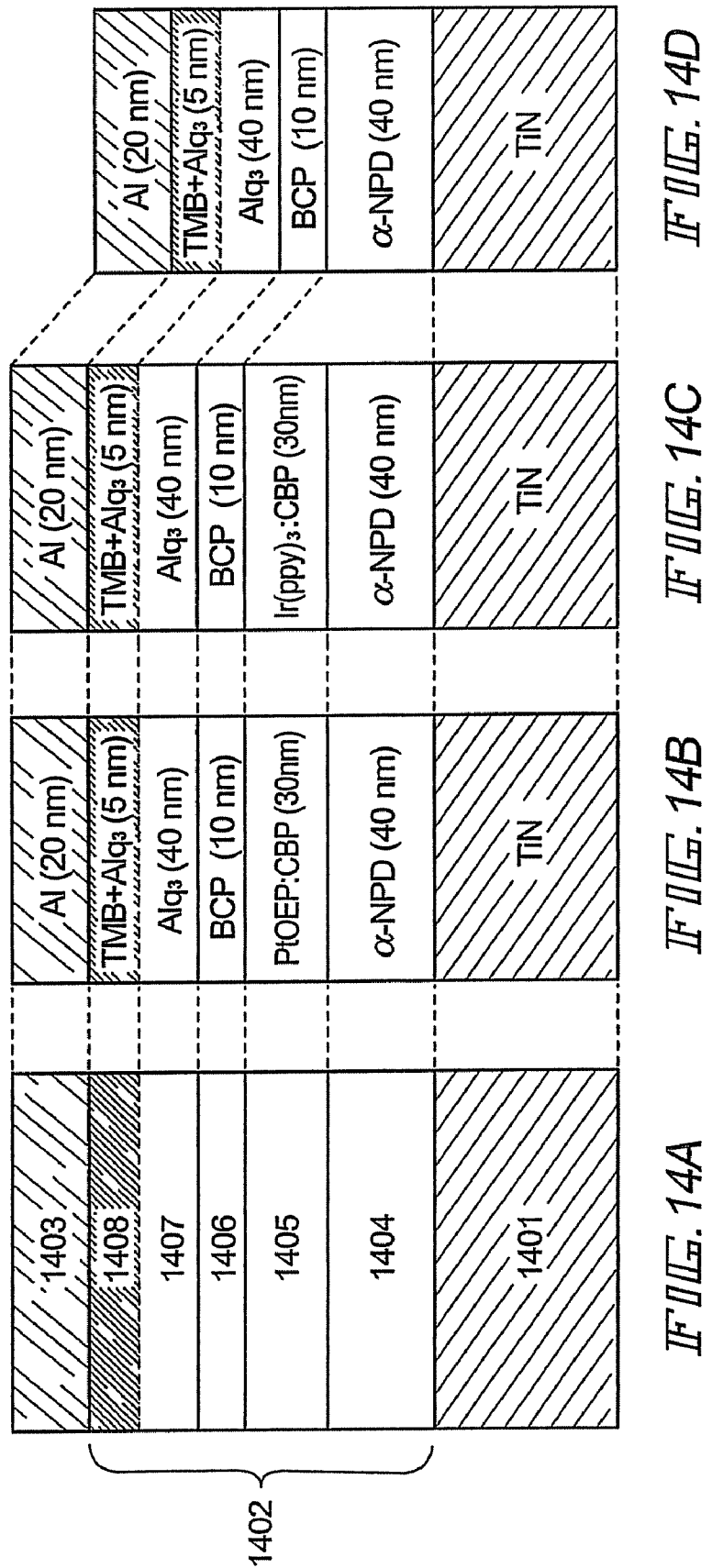

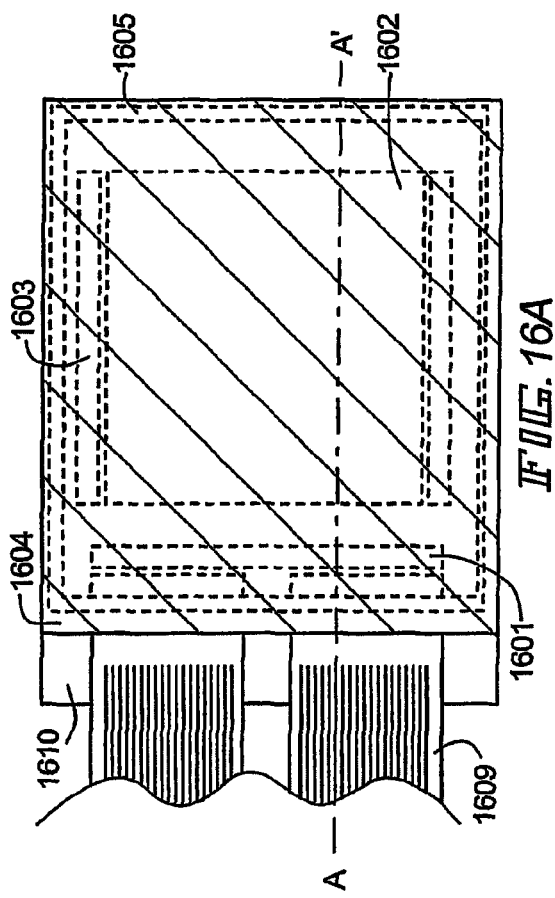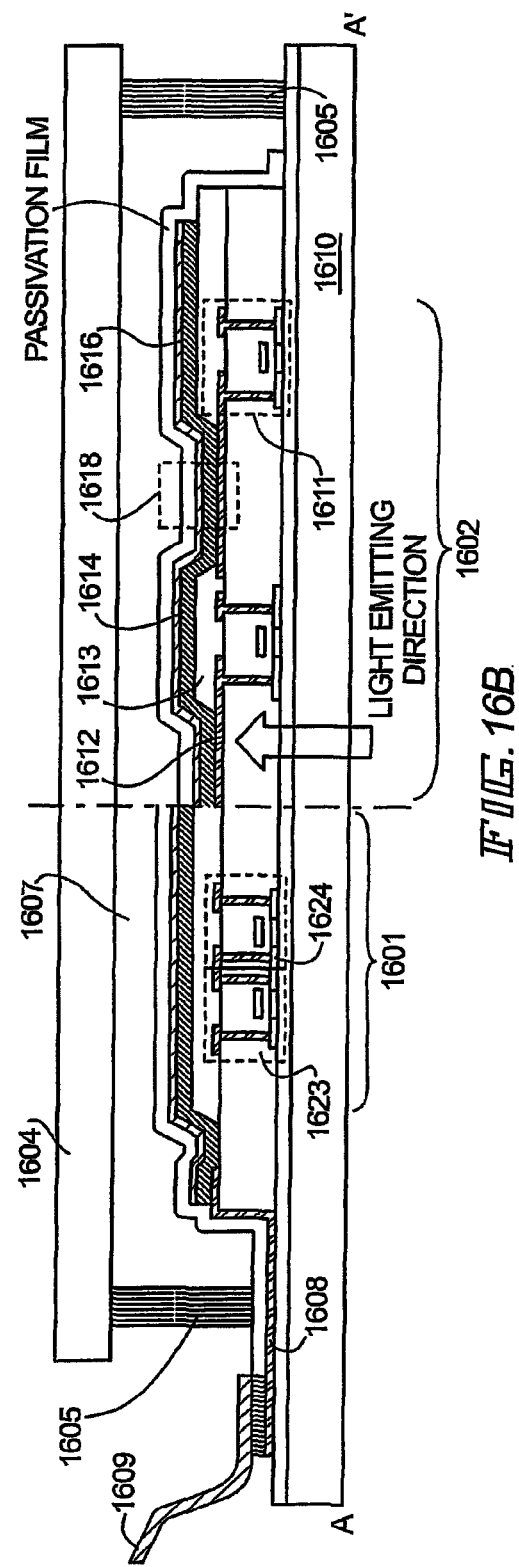
FIG. 16A
FIG. 16B

LIGHT EMITTING DEVICE

This application is a continuation of U.S. application Ser. No. 11/600,266, filed on Nov. 15, 2006 now U.S. Pat. No. 7,372,076 which is a continuation of U.S. application Ser. No. 10/304,238 filed on Nov. 26, 2002 (now U.S. Pat. No. 7,141,817 issued Nov. 28, 2006).

BACKGROUND OF THE INVENTION

1. Field of the Invention

The present invention relates to a light emitting device and a manufacturing method thereof using a light emitting element which has a film containing an organic compound (hereinafter referred to as an "organic compound layer") between a pair of electrodes and which can give fluorescence or luminescence by receiving an electric field. The light emitting device referred to in the present specification is an image display device, a light emitting device or a light source. Additionally, the following are included in examples of the light emitting device: a module wherein a connector, for example, a flexible printed circuit (FPC) or a tape automated bonding (TAB) tape, or a tape carrier package (TCP) is set up onto a light emitting element; a module wherein a printed wiring board is set to the tip of a TAB tape or a TCP; and a module wherein integrated circuits (IC) are directly mounted on a light emitting element in a chip on glass (COG) manner.

2. Description of the Related Art

A light emitting element in the present invention is an element for emitting light by applying an electric field thereto. With respect to the light emitting mechanism, it is said that an electron injected from a cathode and a hole injected from an anode are recombined in an organic compound layer by applying a voltage to electrodes sandwiching an organic compound layer to produce a molecule with an excitation state (hereinafter referred to as "a molecular exciton") and the molecular exciton releases energy to emit light when it is returned to a ground state.

In such a light emitting element, the organic compound layer is generally made from a thin film having a thickness less than 1 μm. In addition, since the light emitting element is a self-luminous type element such that the organic compound layer itself emits light, a back light used in a conventional liquid crystal display is not required. Thus, it is the big advantage that an extremely thin and lightweight light emitting element can be manufactured.

Also, when the carrier mobility of, for example, an organic compound layer having a thickness of about 100 nm to 200 nm is considered, a period from the injection of a carrier to the recombination is about several ten nanoseconds. Even when a period required for a process from the recombination of a carrier to light emission is included in the period, light emission is conducted within the order of microsecond. Thus, an extremely high response speed is one of characteristics thereof.

From characteristics such as a thin type, lightweight, high speed responsibility, and direct-current low-voltage drive, the light emitting element has been noted as a next generation flat panel display element. In addition, since the light emitting element is a self-luminous type and has a wide viewing angle, the visibility is relatively good. Thus, it is considered that the light emitting element is effective as an element used for a display screen of a mobile electronic apparatus.

Tang et al. of Eastman Kodak company succeeded to obtain high luminance and high efficiency that are sufficient to put into practical application with luminance of 1000 cd/m$^2$ at 10 V or less and external quantum efficiency of 1% by laminating organic compounds having different carrier transportation in order to improve the characteristics of elements in which holes and electros are injected from each anodes and cathodes with sufficient balance and the thickness is set to 200 nm or less (Reference 1: Appl. Phys. Lett., 51, 913 (1987)). With respect to the high quantum efficiency elements, Tang uses Mg (magnesium) having small work function to the organic compound that is basically regarded as insulators in order to lower the energy barrier generated with injection of electrons from metal electrodes. However, Mg is easily oxidizable, instable, and has poor adhesion property to the organic surface, so that Mg is co-deposited with Ag (argentine) that is relatively stable and has high adhesion property to the organic surface to be alloyed is used.

The group of Toppan Printing Company reported that lower driving voltage and higher luminescence than the element using Mg alloy by alloying Li (lithium) having smaller work function than Mg with Al (aluminum) in order to stabilize as to use as cathode (Reference 2: 51st Japanese Society of Applied Physics Annual Meeting, Digest 28a-PB-4, p. 1040).

In light of the background art of the above-mentioned alloy electrodes, it has been desired to develop more stable cathodes. In recent years, it has been reported that by interposing a cathode buffer layer made of lithium fluoride (LiF) or the like as a super-thin insulating layer (0.5 nm), even an aluminum cathode can give luminescence property equivalent to or more than that of alloy of Mg and Ag, or the like alloy (Reference 3: L. S. Hung, C. W. Tang and M. G. Mason: Applied Physics Letters, 70 (2), 152 (1997).

The mechanism of the property improvement by disposing this cathode buffer layer would be as follows: when LiF constituting the cathode buffer layer is formed to contact $Alq_3$ constituting an electron transport layer of an organic compound layer, the energy band of $Alq_3$ is bent to lower an electron injection barrier.

Another report is that improving the injection of electron from cathode by reducing the electron injection barrier from cathode to the organic compound layer by forming a metal doping layer in the organic compound layer contacting with a cathode of the light emitting element, the doping layer is made from one or more metals from the following: alkali metals having 4.2 eV or more work functions, alkaline earth metals, and transition metals including rare earth metals (Japanese Patent Application laid-open No. Hei 10-270171).

As described above, in a light emitting element composed of an anode, a cathode and an organic compound layer, an invention is made for improving the capability of injecting carriers from the electrode, resulting from an element characteristic of the light emitting element.

Further, there is another report that the carrier density according to the improvement of hole injection and conductivity can be increased by doping the electron acceptance materials to the hole transporting layer contacting with the anode of the light emitting element. Thus, a low driving voltage can be realized to (Reference 4: J. Blochwitz, M. Pfeiffer, T. Fritz, and K. Leo, Applied Physics Letters, vol. 73, No. 6, p. 729 (1998)).

However, with respect to the active matrix light emitting device, when above-described cathode buffer layer and metal doping layer are provided between the organic compound layer and the cathode in order to improve the element characteristics of the light emitting element, the injection from the cathode is improved, meanwhile, TFT characteristics is deteriorated since the alkali metals and alkaline earth metals contained in a part of the cathode buffer layer and the metal doping layer are diffused to drift, and the TFT connected to the light emitting element is influenced by that. Thus, the characteristics of the light emitting element is improved, but then, the characteristics of TFT is deteriorated.

By doping the electron acceptance material, the carrier density according to the improvement of the hole injection and conductivity can be increased, meanwhile, the organic compounds functioning as an acceptor is possible to form a charge-transfer complex. In the case that the charge-transfer complex exists at the interface with the light emitting layer, an energy produced by recombination of carrier generated on the light emitting layer moves to a non-luminous charge-transfer complex to be quenched. The same is equally true of donor that improves electron injection by doping the electron dose materials.

SUMMARY OF THE INVENTION

It is therefore an object of the present invention to provide the light emitting element that has a mechanism to prevent the light emitting element from quenching due to the removal of the energy produced by recombination of carrier on the light emitting layer, and also improve the carrier injection without using influential materials to TFT characteristics such as alkali metals and alkaline earth metals that are used conventionally.

In order to resolve the aforementioned problems, the present invention can form donor levels between the respective lowest unoccupied molecular orbitals (LUMOs) between a cathode and an organic compound layer. This is accomplished by doping an organic compound that functions as an electron donor (hereinafter referred to as donor molecules) for applying electrons to the organic compound layer that contacts the cathode. Injection of electrons from the cathode and transmission of the injected electrons can therefore be performed with good efficiency. Further, there are no problems such as excessive energy loss accompanying electron movement and changes in quality of the organic compound layer itself, and therefore an increase in the electron injecting characteristics can be achieved, along with a lowering of driver voltage, regardless of the work function of the cathode material.

In addition, there is no problem in that the donor molecules diffuse to reduce TFT characteristics, and therefore the characteristics of a light emitting device can be improved without any of the pitfalls present when alkaline metals or alkaline earth metals are used.

An electron transmitting region is formed in the present invention by doping donor molecules into a portion of the electron transporting layer contained in the organic compound layer. Note that the electron transmitting region formed here is formed to contact the cathode of the light emitting device, and therefore the injecting characteristics of electrode from the cathode can be raised. In addition, there is an electron transporting layer into which the donor molecules are not doped, and therefore a structure in which there is no direct contact between the electron transmitting region and the light emitting layer can be formed.

For cases in which an electric charge transfer complex is formed by the donor molecules in the electron transmitting region, if the electric charge transfer complex exists in an interface with the light emitting layer, this structure can prevent problems in which energy generated due to carrier recombination in the light emitting layer is transferred to the non-light emitting electric charge transfer complex, thus optically quenching light.

That is, the light emitting element of the present invention is characterized in that the organic compound layer is formed between an anode and the cathode. The organic compound layer has the light emitting layer, and the electron transmitting region containing the donor molecules. The electron transmitting region is formed contacting the anode without contacting the light emitting layer.

According to a structure of the present invention, there is provided a light emitting device including: an anode; a cathode; and an organic compound layer, the device being characterized in that: the organic compound layer is formed between the anode and the cathode; the organic compound layer has a light emitting layer and an electron transporting layer; at least a portion of the electron transporting layer contacts the cathode, through an electron transmitting region; and the electron transmitting region contains donor molecules, and is formed to contact the cathode.

Further, according to another structure of the present invention, there is provided a light emitting device including: a TFT formed on an insulating surface; an interlayer insulating film formed on the TFT; a first electrode formed on the interlayer insulating film; an insulating layer formed covering an edge portion of the first electrode; an organic compound layer formed on the first electrode; and a second electrode formed on the organic compound layer, the device being characterized in that: the TFT has a source region and a drain region; the first electrode is electrically connected to one of the source region and the drain region; the organic compound layer has a light emitting layer and an electron transporting layer; at least a portion of the electron transporting layer contacts the cathode through an electron transmitting region; and the electron transmitting region is formed to contact the cathode.

In the light emitting device according to one of the above-mentioned structures, when the first electrode is an anode and the second electrode is a cathode, the electron transmitting region is formed so as to be in contact with the second electrode, whereas when the first electrode is a cathode and the second electrode is an anode, the electron transmitting region is formed so as to be in contact with the first electrode.

Further, from among a hole injecting layer, a hole transporting layer, the light emitting layer, a blocking layer, the electron transporting layer, and the electron transmitting region formed in a portion of the electron transporting region, the organic compound layer contains the light emitting layer, the electron transporting layer, and the electron transmitting region in each of the above-mentioned structures. The electron transmitting region is made from an organic compound containing donor molecules.

In addition, a hole transmitting region containing acceptor molecules may also be formed in a portion of the hole transporting layer or the hole injecting layer in each of the above-mentioned structures. If the hole transmitting region is formed, then a structure is used in which the hole transmitting region is formed to contact the anode, and further, in which the hole transmitting region and the light emitting layer do not have direct contact.

Note that although the light emitting device of the present invention has a structure suitable for an active matrix light emitting device having light emitting elements electrically connected to TFTs, it is also possible to implement the present invention in a passive light emitting device.

Note that the luminescence obtained from the light emitting device of the present invention includes light emission from a singlet excitation state, from a triplet excitation state, or from both types of excitation states.

BRIEF DESCRIPTION OF THE DRAWINGS

In the accompanying drawings:

FIGS. 10A to 10C are diagrams for explaining a process of manufacturing a light emitting device of the present invention;

FIGS. 11A to 11C are diagrams for explaining the process of manufacturing the light emitting device of the present invention;

FIGS. 13A and 13B are diagrams for explaining the process of manufacturing the light emitting device of the present invention;

FIGS. 14A to 14D are diagrams for explaining the element structure of the light emitting device of the present invention;

FIGS. 16A and 16B are diagrams for explaining the element structure of the light emitting device of the present invention;

DETAILED DESCRIPTION OF THE PREFERRED EMBODIMENTS

Embodiment Mode 1

Figure 1:
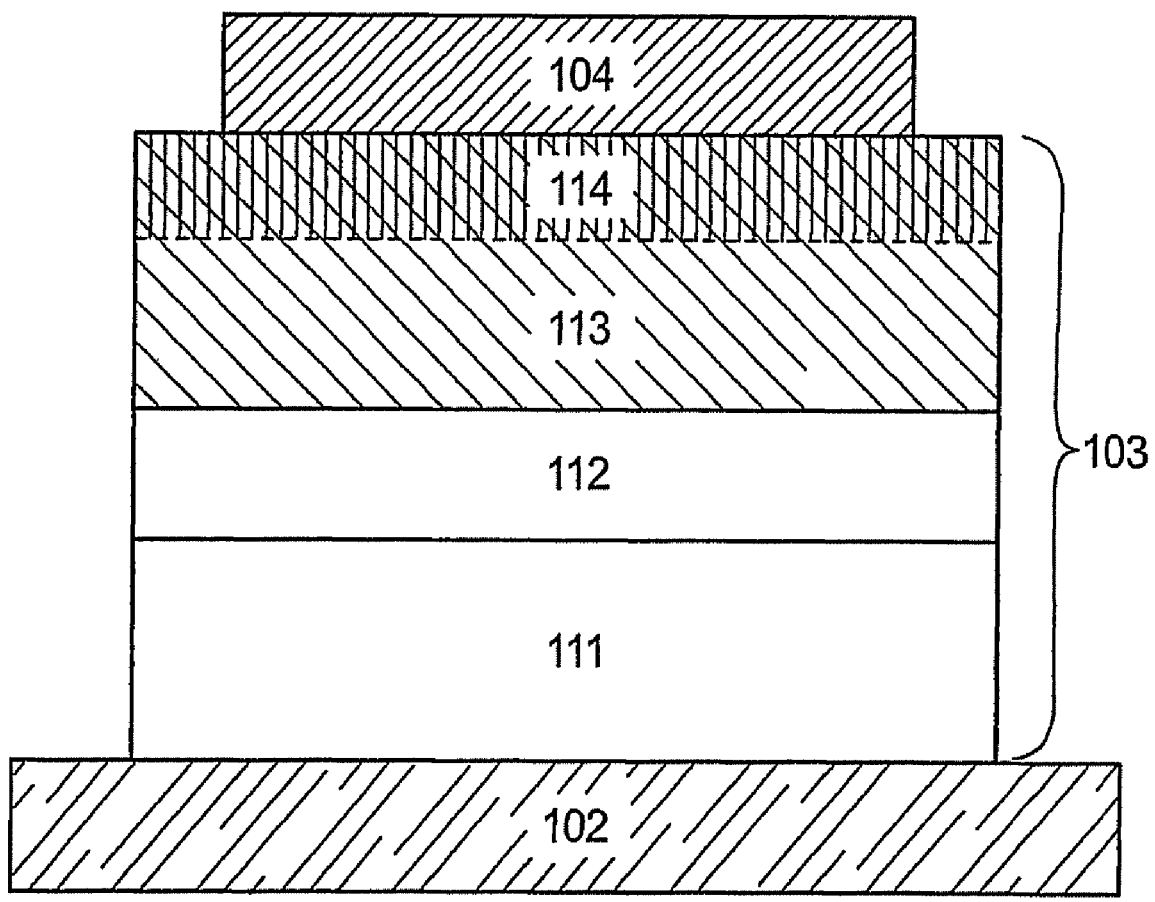
FIG. 1 is a diagram for explaining the element structure of a light emitting device of the present invention.

The element structure of a light emitting device of the present invention is explained using FIG. 1.

An organic compound layer 103 is formed on an anode 102 in FIG. 1, and a cathode 104 is formed on the organic compound layer 103. Note that holes are injected to the organic compound layer 103 from the anode 102, and electrons are injected to the organic compound layer 103 form the cathode 104. The holes and the electrons recombine in the organic compound layer 103, and thus luminescence is obtained.

Further, the organic compound layer 103 contains at least a hole transporting layer 111, a light emitting layer 112, an electron transporting layer 113, and an electron transmitting region 114 formed in a portion of the electron transporting layer, and is formed from one layer or a plurality of layers that are laminated, having different functions with respect to carriers, such as a hole injecting layer, a hole transporting layer, or a blocking layer. Note that a case in which the organic compound layer 103 has a laminate structure composed of the hole transporting layer 111, the light emitting layer 112, the electron transporting layer 113, and the electron transmitting region 114 is explained in Embodiment Mode 1.

Light developed in an organic compound layer may be emitted from an anode side in the present invention, and may also be emitted from a cathode side. Note that it is essential to form the anode by a material through which light passes if light is emitted from the anode side, and that the element characteristics can be increased greatly by forming the cathode by a material having light-shielding characteristics. Further, it is preferable to form the cathode by using a material through which light passes, and the anode by using a light-shielding material if light is emitted from the cathode side.

A material having a large work function equal to or greater than 4.5 eV is used as a material for forming the anode 102 in order not to impede hole injection from the anode. Note that suitable materials differ depending on whether the anode has translucent characteristics or light-shielding characteristics.

If the anode 102 is formed by a material through which light passes, then it can be formed by using a transparent conductive film such as an indium tin oxide (ITO) film, a transparent conductive film in which 2 to 20% zinc oxide (ZnO) is mixed into indium oxide, IZO, or a material composed of indium oxide and zinc oxide ($In_2O_3$—ZnO).

On the other hand, a metallic compound that is nitride or carbide of a metallic element residing in group 4, group 5, or group 6 of the periodic table can be used for cases in which the anode 102 is formed by a light-shielding material. Preferably, the anode 102 can be formed by using titanium nitride, zirconium nitride, titanium carbide, zirconium carbide, tantalum nitride, tantalum carbide, molybdenum nitride, or molybdenum carbide.

Note that these metallic compounds have work functions equal to or greater than 4.7 eV. For example, titanium nitride (TiN) has a work function of 4.7 eV. Further, the metallic compounds can be given an additionally larger work function by ultraviolet radiation processing under an ozone atmosphere (UV ozone processing).

The organic compound layer 103 is formed next. Note that known low molecular-based organic compounds, high molecular-based organic compounds, and intermediate molecular-based organic compounds can be used as materials for forming the organic compound layer 103. Note that the term intermediate molecular-based organic compound denotes aggregates of organic compounds not having sublimation or melting characteristics (with the number of molecules preferably equal to or less than 10), and organic compounds in which the molecular chain length is equal to or less than 5 μm (preferably equal to or less than 50 nm).

Note that organic compounds like those shown below can be used in the organic compound layer 103 of the light emitting element formed in accordance with Embodiment Mode 1.

The organic compound layer 103 is formed by laminating the hole transporting layer 111 made from a material having hole transporting characteristics, the light emitting layer 112 made from a material having light emitting characteristics, the electron transporting layer 113 made from a material having electron transporting characteristics, and the electron transmitting region 114 containing donor molecules in a portion of the electron transporting layer. Note that the laminate structure of the organic compound layer in the present invention is not limited to the structure shown here. In addition, it is also possible to use a laminate structure containing a hole injecting layer made from a hole injecting material, and a blocking layer (hole inhibiting layer) made from a material having hole blocking characteristics. Examples of appropriate materials for each layer type are shown below. Note that the materials used in the light emitting element of the present invention are not limited to these.

As the hole transporting material used for forming the hole transporting layer 111, an aromatic amine-based (that is, the one having a benzene ring-nitrogen bond therein) compound is preferred. Widely used materials include, for example, in addition to the above-mentioned TPD, derivatives thereof such as 4,4'-bis[N-(1-naphthyl)-N-phenyl-amino]-biphenyl (hereafter, referred to as "α-NPD"). Also used are star burst aromatic amine compounds, including: 4,4',4"-tris(N,N-biphenyl-amino)-triphenyl amine (hereafter, referred to as "TDATA"); and 4,4,4"-tris[N-(3-methylphenyl)-N-phenyl-amino]-triphenyl amine (hereafter, referred to as "MTDATA").

Specific examples of the light emitting material used for forming the light emitting layer 112 include metal complexes such as tris(8-quinolinolate) aluminum (hereafter, referred to as $Alq_3$), tris(4-methyl-8-quinolinolate) aluminium (hereafter, referred to as $Almq_3$), and bis(10-hydroxybenzo[h]-quinolinate) beryllium (hereafter, referred to as $BeBq_2$), and bis (2-methyl-8-quinolinolate)-(4-hydroxy-biphenylyl)-aluminum (hereafter, referred to as BAlq). The examples also include metal complexes including such as bis[2-(2-hydroxyphenyl)-benzooxazolate]zinc (hereafter, referred to as $Zn(BOX)_2$) and bis[2-(2-hydroxyphenyl)-benzothiazolate] zinc (hereafter, referred to as $Zn(BTZ)_2$). Also, fluorescent dyes thereof may be used. Triplet light emission materials may also be used and main examples thereof include complexes with platinum or iridium as central metal. Known triplet light emission materials include tris(2-phenylpyridine) iridium (hereafter, referred to as $Ir(ppy)_3$), 2,3,7,8,12,13,17,18-octaethyl-21H, and 23H-porphyrin-platinum (hereafter, referred to as PtOEP).

Metal complexes are often used as the electron transporting material. Preferred examples thereof include: metal complexes having a quinoline skeleton or benzoquinoline skeleton, such as the aforementioned $Alq_3$, $Almq_3$, $BeBq_2$; and mixed ligand complexes such as BAlq. Other examples include metal complexes having oxazole-based and thiazole-based ligands such as $Zn(BOX)_2$ and $Zn(BTZ)_2$. Other materials that are capable of transporting electrons than the metal complexes are: oxadiazole derivatives such as 2-(4-biphenyl)-5-(4-tert-butylphenyl)-1,3,4-oxadiazole (hereafter referred to as PBD), and 1,3-bis[5-(p-tert-butylphenyl)-1,3,4-oxadiazole-2-yl]benzene (hereafter, referred to as OXD-7); triazole derivatives such as 3-(4-tert-butylphenyl)-4-phenyl-5-(4-biphenylyl)-1,2,4-triazole (hereafter, referred to as TAZ) and 3-(4-tert-butylphenyl)-4-(4-ethylphenyl)-5-(4-biphenylyl)-1,2,4-triazole (hereafter, referred to as p-EtTAZ); and phenanthroline derivatives such as bathophenanthroline (hereafter, referred to as BPhen) and bathocuproin (hereafter, referred to as BCP).

Note that, in addition to the organic materials described above, it is also is possible to use an inorganic material (specifically, materials such as Si and Ge oxides, carbon nitrides (CxNy), alkaline metal elements, alkaline earth metal elements, and metal materials in which lanthanide element oxides are combined with Zn, Sn, V, Ru, Sm, or Ir) as a material used in a portion of the hole transporting layer 111, the light emitting layer 112, or the electron transporting layer 113 of the organic compound layer 103 of the present invention.

The electron transmitting region 114 is formed using donor molecules containing the molecular skeletons denoted by the following structural formulae (D1) to (D7) in at least a portion therein, and an electron transporting material. Note that, from the standpoint of increasing the transporting characteristics of electrons injected, to the electron injecting layer, and increasing the conductive characteristics of the electron transmitting region, it is preferable that the structural formulae (D1) to (D7) be contained at a level of 50% or more of the entire electron transmitting region 114.

Formulae (D1): fulvalene type donor

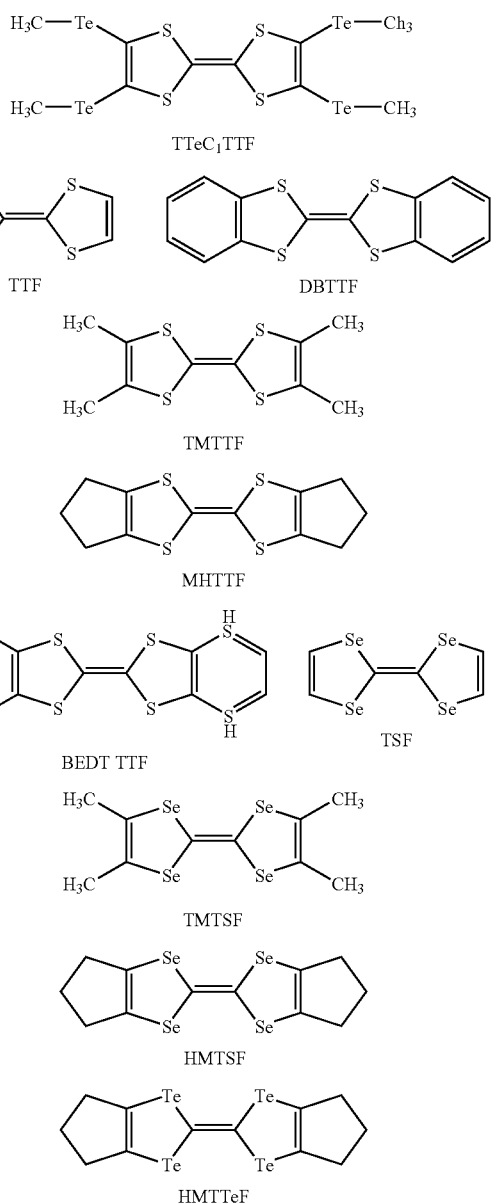

Formulae (D2): hetero cyclic donor containing sulfer

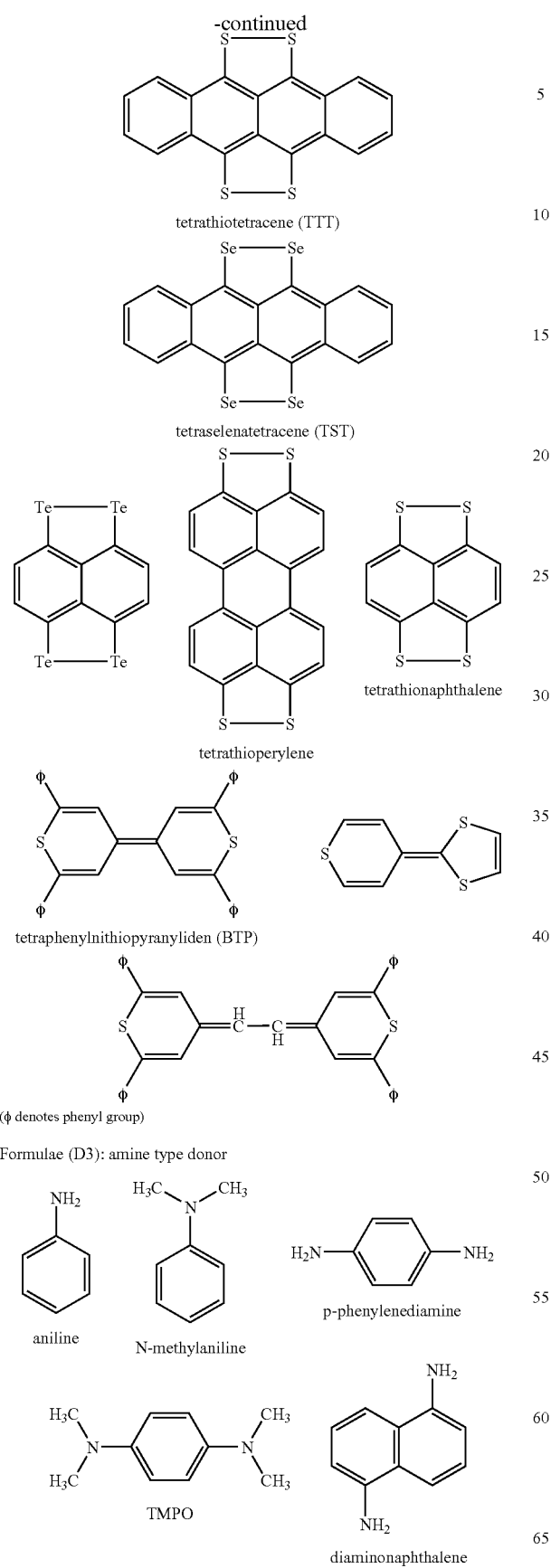
Formulae (D3): amine type donor
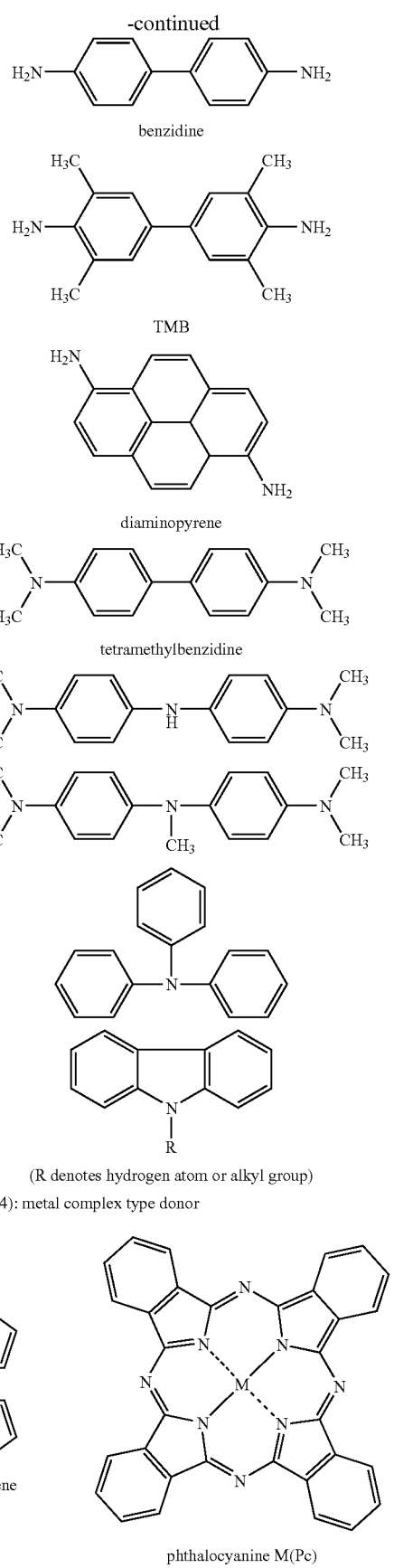
Formulae (D4): metal complex type donor

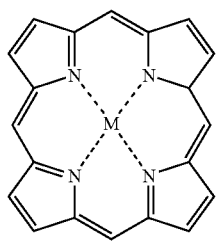

porphyrin

Formulae (D5): cyanine pigment donor

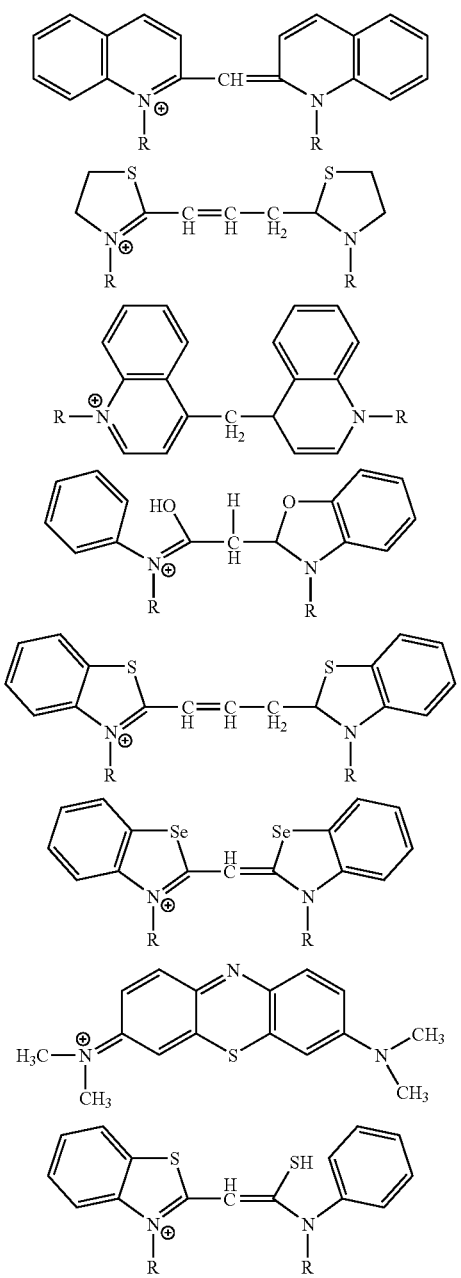

(R denotes hydrogen atom or alkyl group)

Formulae (D6): hetero cyclic donor containing nitrogen

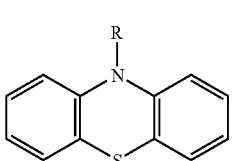
phenothiazine

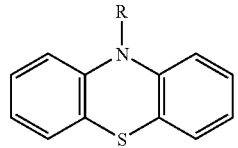
phenazine

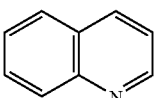
quinoline

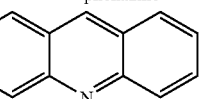
acridine

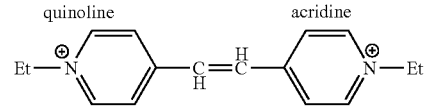

DEPE$^{2+}$ (Et denotes ethyl group and R denotes hydrogen atom or alkyl group)

Formulae (D7): polymer type donor

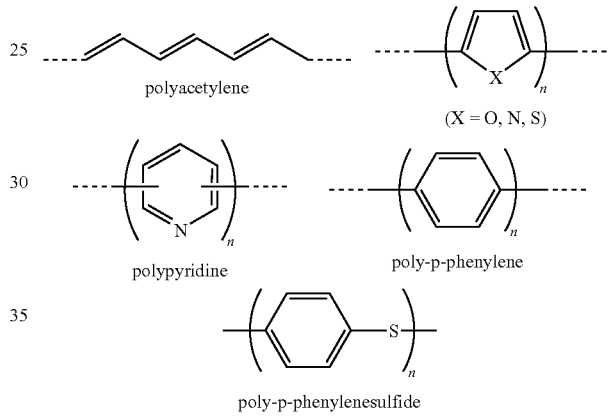

In addition, if the organic compound layer contains a hole injecting layer, then porphyrins are effective as hole injecting materials for forming the hole injecting layer, provided that the hole injecting material used is an organic compound, and phthalocyanine (hereinafter referred to as $H_2$-Pc), copper phthalocyanine (hereinafter referred to as Cu-Pc), and the like may be used. There are also materials to which chemical doping has been performed available as conductive high molecular-based compounds, and polyethylene dioxythiophene (hereinafter referred to as PEDOT) into which polystyrene sulfone (hereinafter referred to as PSS) is doped, polyaniline, polyvinyl carbazole (hereinafter referred to as PVK), and the like can be given as examples.

In addition, for cases in which a blocking layer is included in the organic compound layer, the above-mentioned BAlq, OXD-7, TAZ, p-EtTAZ, p-EtTAZ, BPhen, BCP, and the like are effective as hole blocking materials for forming the hole blocking layer because of their high excitation energy level.

Note that a structure can be used in the present invention in which the materials used in forming the hole transporting layer 111 and the light emitting layer 112 are co-evaporated, forming a mixed layer in the interface between the two layers. Similarly, it is also possible to use a structure in which a mixed layer is formed in the interface between the light emitting layer 112 and the electron transporting layer 113.

The cathode 104 is formed next. A material having a small work function equal to or less than 3.8 eV is used as the material forming the cathode 104 in order to increase the injecting characteristics of electrons from the cathode 104. Note that it is preferable that the transmittivity of a cathode 104 with respect to visible light be equal to or greater than 40% for cases in which the cathode 104 has translucency. On the other hand, the cathode 104 is formed by a film having a visible light transmittivity less than 10% for cases in which the cathode 104 has light-shielding characteristics. For example, the cathode 104 may be formed by a single layer film of Al, Ti, W, or the like, or a laminate film with a material having a small work functions.

The light emitting element of the present invention, made from the anode 102, the organic compound layer 103, and the cathode 104, and in which the electron transmitting region 114 is formed in a region where the organic compound layer 103 contacts the cathode, can thus be formed.

Note that, although not shown in the figures, it is also possible to form a hole transmitting region in the present invention, not only the electron transmitting region. The hole transmitting region is formed by using acceptor molecules that contain the molecular skeletons denoted by the following structural formulae (A1) to (A4) in at least a portion therein, and a hole transporting material or a hole injecting material. Note that, from the standpoint of increasing the transporting characteristics of holes injected, and increasing the conductive characteristics of the hole transmitting region, it is preferable that the structural formulae (A1) to (A4) be contained at a level of 50% or more of the entire hole transmitting region.

Formulae (A1): cyano type acceptor

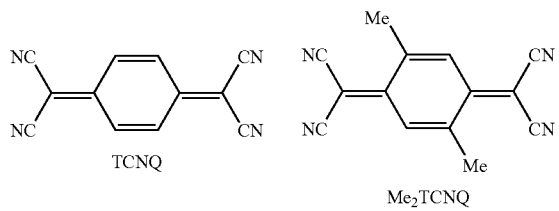
TCNQ     Me₂TCNQ

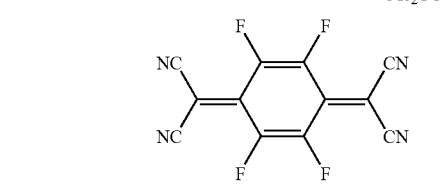
F₄TCNQ

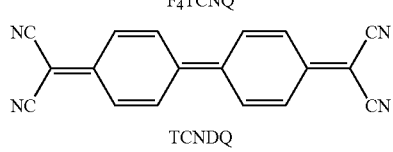
TCNDQ

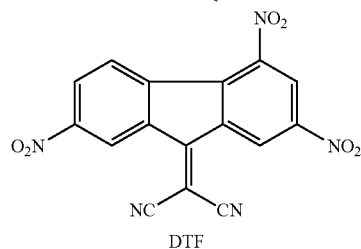
DTF

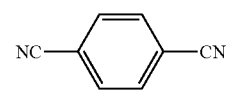
dicyanobenzene (PCKB)

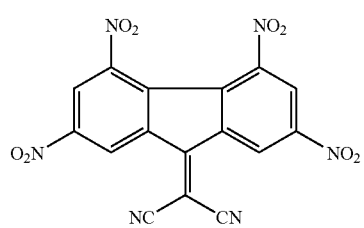
Formulae (A2): quinone type acceptor

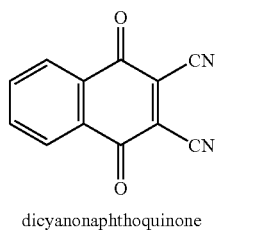 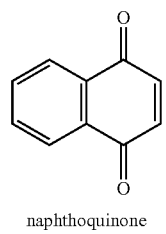
dicyanonaphthoquinone     naphthoquinone

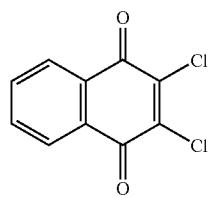
2,3-dichloronaphthoquinone

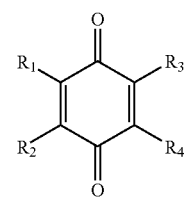
(each of R1 to R4 denotes hydrogen atom, halogen atom, alkyl group, alkenyl group, aryl group, alkyloxy group, alkythio group, alkyloxy carbonyl group, cyano group, nitro group, hydroxyl group, amino group, carboxyl group, acetyl group, formyl group)

Formulae (A3): nitro compound type acceptor

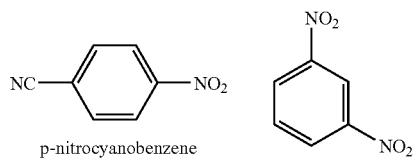
p-nitrocyanobenzene     1,3-dinitrobenzene

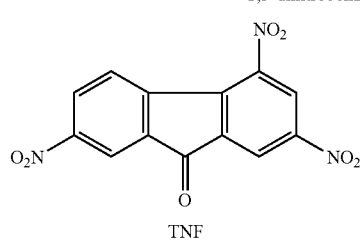
TNF

-continued

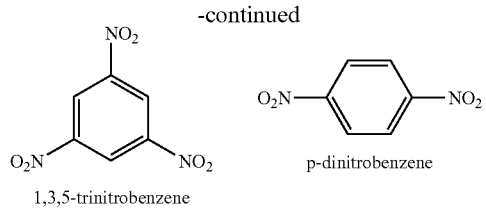

1,3,5-trinitrobenzene          p-dinitrobenzene

Formulae (A4): quinodiimine type acceptor

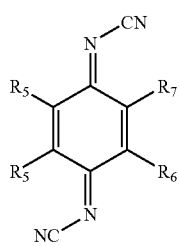

(each of R5 to R7 denotes hydrogen atom, halogen atom, alkyl group, alkenyl group, aryl group, alkyloxy group, alkylthio group, alkyloxy carbonyl group, cyano group, nitro group, hydroxyl group, amino group, carboxyl group, acetyl group, formyl group)

Embodiment Mode 2

Figure 2A:
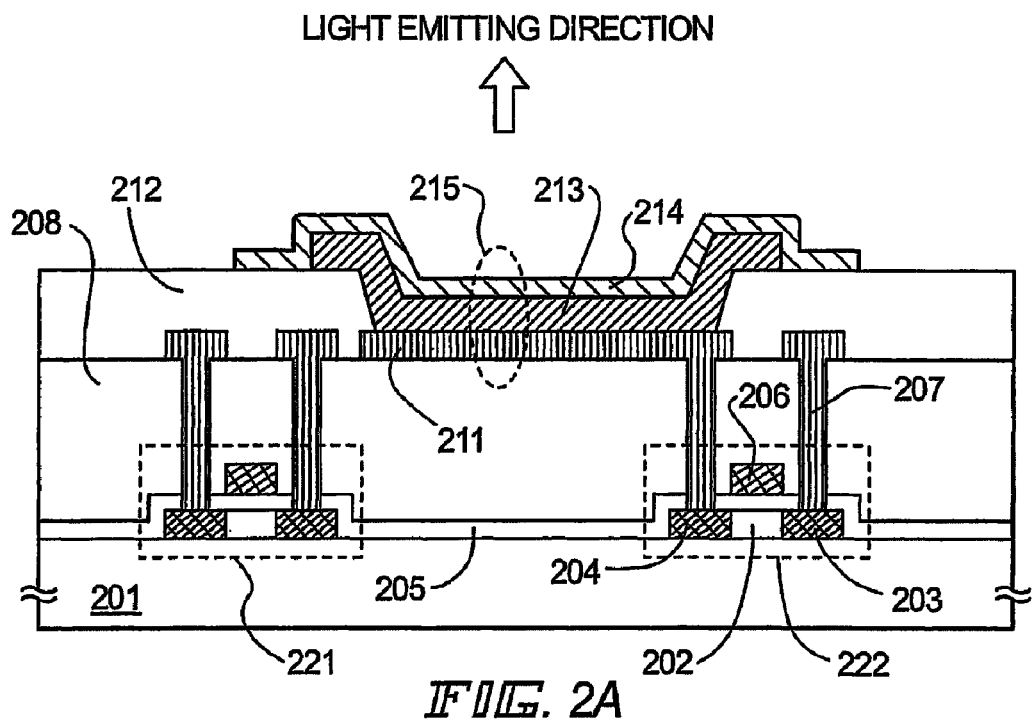
FIGS. 2A and 2B are diagrams for explaining the element structure of an upward-emission type light emitting device.
Figure 2B:
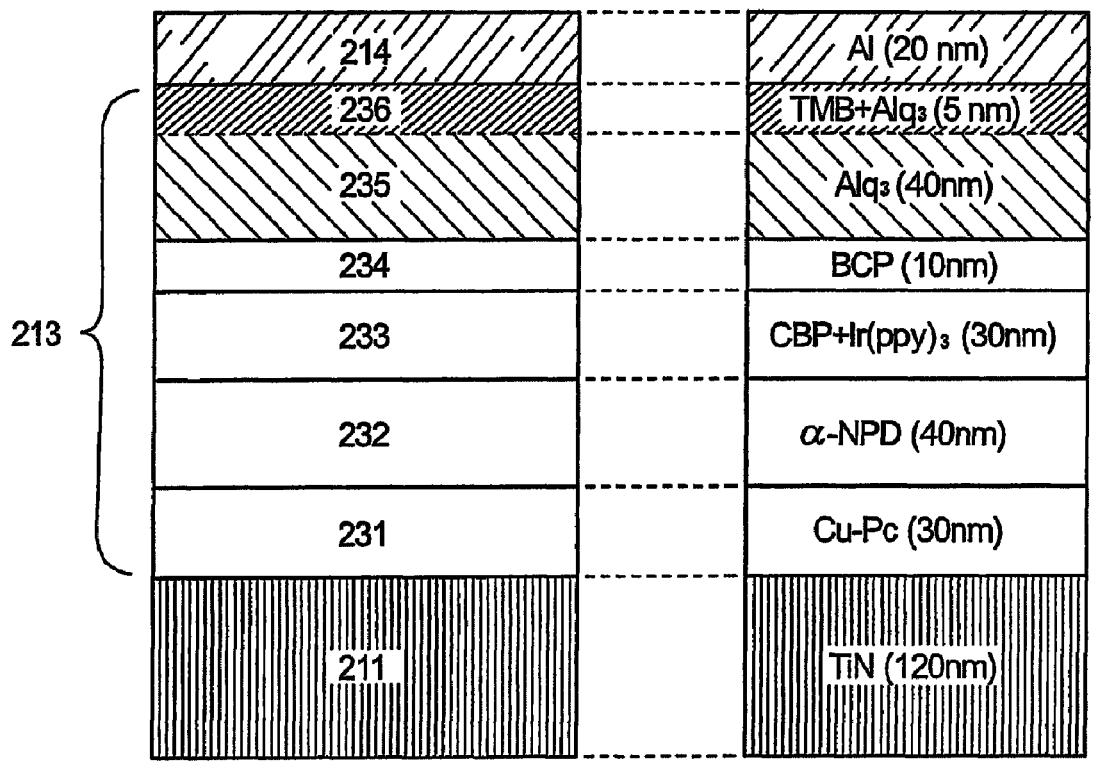

The element structure of a light emitting element in a light emitting device formed in accordance with the present invention is explained using FIGS. 2A and 2B. Note that FIG. 2A is a diagram showing the cross sectional structure of a pixel portion of a light emitting devices and FIG. 2B is a diagram showing the element structure of a light emitting element. Specifically, an upward-emission type element structure is explained for a case in which one electrode is electrically connected to an electric current control TFT, and another electrode, formed sandwiching an organic compound layer therebetween, is a cathode made from a material through which light passes.

Thin film transistors (TFTs) are formed on a substrate 201 in FIG. 2A. Note that an electric control TFT which is electrically connected to a first electrode to 210 of a light emitting element 215, and which functions to control electric current supplied to the light emitting element 215, and a switching TFT 221 for controlling a video signal applied to a gate electrode of an electric current control TFT 222 are shown here.

A silicon substrate having light-shielding characteristics is used here as the substrate 201, but a glass substrate, a quartz substrate, a resin substrate, and a flexible substrate material (plastic) may also be used. Further, active layers of each TFT are provided with at least a channel forming region 202, a source region 203, and a drain region 204.

Furthermore, the active layer of each TFT is covered by a gate insulating film 205, and a gate electrode 206 is formed overlapping with the channel forming region 202 through the gate insulating film 205. An interlayer insulating film 208 is formed covering the gate electrode 206. Note that insulating films containing silicon, such as silicon oxide, silicon nitride, and silicon oxynitride films, and in addition, organic resin films of polyimide, polyamide, acrylic (including photosensitive acrylic) and BCB (benzocyclobutene) can be used as materials for forming the interlayer insulating film 208.

A wiring 207 which is electrically connected to the source region 203 of the electric current control TFT 222 is formed next on the interlayer insulating film 208, and a first electrode 211 which is electrically connected to the drain region 204 is formed. Note that the first electrode 211 is formed so as to become an anode in Embodiment Mode 2. The first electrode (anode) 211 uses a material having a large work function and functioning as an anode. It is preferable that a conductive material having light-shielding characteristics and having high reflectivity be used as the material forming the first electrode 211. Further, it is preferable that the electric current control TFT 222 be formed by a p-channel TFT.

An insulating layer 212 is formed covering an edge portion of the first electrode (anode) 211, the wiring 207, and the like. A light emitting element 215 can be completed by forming an organic compound layer 213 on the first electrode (anode) 211, and forming a second electrode 214 which becomes a cathode on the organic compound layer 213. Note that it is necessary to form the second electrode (cathode) 214 so that it has light transmitting characteristics in Embodiment Mode 2, and therefore the second electrode (cathode) 214 is formed to have a film thickness at which light (visible light) can pass.

The second electrode (cathode) 214 has light transmitting characteristics in Embodiment Mode 2, and therefore this becomes an upward-emission structure in which light developed due to recombination of carriers in the organic compound layer 213 is emitted from the second electrode (cathode) 214 side.

The element structure of the light emitting element of the light emitting device shown in FIG. 2A is explained next in detail using FIG. 2B. In particular, the structure of elements formed using low molecular-based compounds in the organic compound layer is explained.

The first electrode (anode) 211 is formed by a light-shielding metallic compound film. The first electrode (anode) 211 is an electrode which is electrically connected with the electric current control TFT 222 shown in FIG. 2A, and is formed by sputtering using TiN at a film thickness of 120 nm in Embodiment Mode 2. Note that bipolar sputtering, ion beam sputtering, opposing target sputtering, and the like may be used as the sputtering method here.

The organic compound layer 213 is then formed on the first electrode (anode) 211, and a hole injecting layer 231 functioning to increase the injecting characteristics of holes from the anode is formed first. In Embodiment Mode 2, a film formed from copper phthalocyanine (hereinafter referred to as Cu-Pc) is formed by evaporation (resistance heating method) at a film thickness of 30 nm as the hole injecting layer 231.

A hole transporting layer 232 is formed next by a material having superior hole transporting characteristics. A film of 4,4'-bis[N-(1-naphthyl)-N-phenyl-amino]-biphenyl (hereinafter referred to as α-NPD) is formed at a film thickness of 40 nm by evaporation here.

A light emitting layer 233 is formed next. Holes and electrons recombine in the light emitting layer 233 in Embodiment Mode 2, and luminescence develops. Note that the light emitting layer 233 is formed to have a film thickness of 30 nm by co-evaporation using 4,4'-dicarbazole-biphenyl (hereinafter referred to as CBP) as a host material having hole transporting characteristics, and tris(2-phenylpyridine) iridium (hereinafter referred to as Ir(ppy)$_3$), an organic compound having light emitting characteristics.

In addition, a blocking layer 234 is formed. The blocking layer 235 is also referred to as a hole inhibiting layer, and is a layer for preventing useless electric current, that is not involved in recombination, from flowing due to holes injected to the light emitting layer 233 passing through the electron transporting layer and reaching the cathode. Bathocuproin (hereinafter referred to as BCP) is formed at a film thickness of 10 nm by evaporation as the blocking layer 234 in Embodiment Mode 2.

An electron transporting layer 235 is formed next. Note that the electron transporting layer 235 is formed by an electron transporting material that has electron accepting characteristics. $Alq_3$ is formed at a film thickness of 40 nm by evaporation as the electron transmitting layer 235 in Embodiment Mode 2.

In addition, an electron transmitting region 236 can be formed by co-evaporating the electron transporting material with donor molecules. The organic compound layer 213 having a laminate structure is thus completed. Note that the electron transmitting region 236 is formed using donor molecules containing the molecular skeletons shown by the structural formulae (D1) to (D7) in at least a portion therein. A film of the donor molecule 3,3',5,5'-tetramethylbenzidine (hereinafter referred to as TMB) and the electron transporting material $Alq_3$ is formed at a film thickness of 5 nm as the electron transmitting region 236 by using co-evaporation in Embodiment Mode 2.

The second electrode 214 which becomes a cathode is formed next. The second electrode (cathode) 214 is an electrode through which light developed in the organic compound layer 213 passes, and therefore is formed by a material through which light passes. Further, it is necessary that the second electrode (cathode) 214 be formed by a material having a small work function because it is an electrode for injecting electrons into the organic compound layer 213. Aluminum (Al) is formed at a film thickness of 20 nm in Embodiment mode 2, thus forming the second electrode (cathode) 214.

Note that the cathode is formed by an extremely thin film having a thickness of approximately 10 to 30 nm in Embodiment Mode 2 in order to ensure that its transmittivity is equal to or greater than 40%. However, it is not always necessary to make the film thickness thin, provided that a material capable of sufficiently functioning as a cathode and capable of ensuring a transmittivity equal to or greater than 40% is used.

Figure 3:
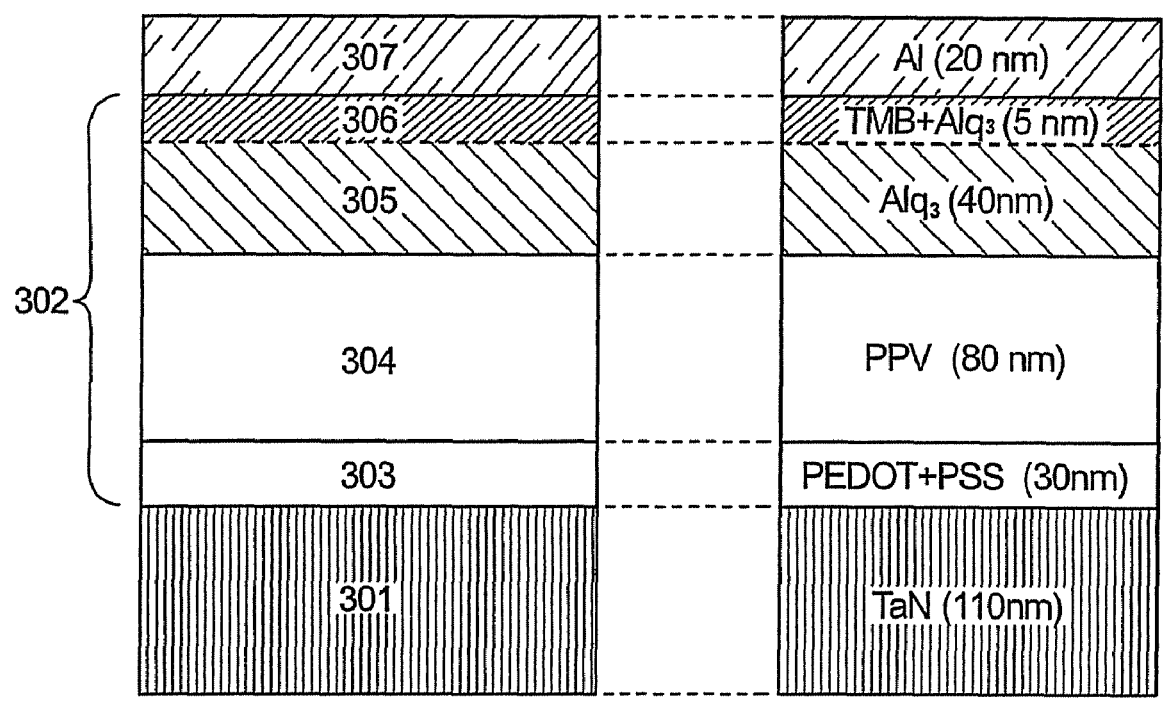
FIG. 3 is a diagram for explaining the element structure of an upward-emission type light emitting device.

In addition, the element structure for a case in which high molecular-based compounds and low molecular-based compounds are used in forming the organic compound layer in the light emitting device having the element structure of Embodiment Mode 2 is explained using FIG. 3.

A first electrode (anode) 301 is formed by a metallic compound film having light-shielding characteristics, similar to FIG. 2B. However, an organic compound layer 302 formed on the first electrode (anode) 301 differs from that of FIG. 2B. The organic compound layer 302 has a laminate structure made form a hole transporting layer 303, a light emitting layer 304, an electron transporting layer 305, and an electron transmitting region 306 formed in a portion of the electron transporting layer 305. Note that a case in which the hole transporting layer 303 and the light emitting layer 304 are formed using high molecular-based compounds is explained.

The hole transporting layer 303 can be formed by using both of PEDOT (poly(3,4-ethylene dioxythiophene)) and polystyrene sulfone (hereinafter referred to as PSS). In addition, the hole transporting layer 303 can also be formed by using both of polyaniline (hereinafter referred to as PANI) and camphor sulfonic acid (hereinafter referred to as CSA). Note that these materials are water soluble, and therefore film formation is performed by application of an application liquid, manufactured by dissolving the materials in water, using spin coating. Note also that the hole transporting layer 303 is formed by a film made from PEDOT and PSS at a film thickness of 30 nm in Embodiment Mode 2.

Also, for the light emitting layer 304, polyparaphenylene vinylene-based, polyparaphenylene-based, polythiophene-based or polyfluorene-based material may be used.

As the polyparaphenylene vinylene-based material, materials such as polyparaphenylene vinylene (poly(p-phenylene vinylene)) (hereafter referred to as PPV), or poly[2-(2'-ethylhexoxy)-5-methoxy-1,4-phenylene vinylene](hereafter referred to as MEH-PPV), which can emit an orange light, and materials such as poly[2-(dialkoxyphenyl)-1,4-phenylene vinylene] (hereafter referred to as ROPh-PPV) which can emit a green light.

As the polyparaphenylene-based material, materials such as poly(2,5-dialkoxy-1,4-phenylene) (hereafter referred to as RO—PPP), poly(2,5-dihexoxy-1,4-phenylene), and the like which can emit a blue light.

As the polythiophene-based material, materials such as poly[3-alkylthiophene](hereafter referred to as PAT), poly[3-hexylthiophene] (hereafter referred to as PHT), poly[3-cyclohexylthiophene] (hereafter referred to as PCHT), poly[3-cyclohexyl-4-methylthiophene] (hereafter referred to as PCHMT), poly[3,4-dicyclohexylthiophene] (hereafter referred to as PDCHT), poly[3-(4-octylphenyl)-thiophene] (hereafter referred to as POPT), poly[3-(4-octylphenyl)-2,2-bithiophene] (hereafter referred to as PTOPT) which can emit a red light.

Further, as the polyfluorene-based material, materials such as poly(9,9-dialkylfluorene)(hereafter referred to as PDAF), or poly(9,9-dioctylfluorene)(hereafter referred to as PDOF) which can emit a blue light.

Note that, these materials are obtained by applying solution obtained by dissolving the materials in an organic solvent using the application method. Examples of the organic solvent used here include toluene, benzene, chlorobenzene, dichlorobenzene, chloroform, tetralin, xylene, dichloromethane, cyclohexane, NMP (N-methyl-2-pyrrolidone), dimethyl sulfoxide, cyclohexanone, dioxane and THF (tetrahydrofuran).

Note that the light emitting layer 304 is formed in Embodiment Mode 2 to have a film thickness of 80 nm by spin coating or ink jet printing using an application liquid manufactured by dissolving PPV in toluene.

An electron transporting layer 305 is formed next on the light emitting layer 304. Note that the low molecular-based compound $Alq_3$ is used as the material for forming the electron transporting layer 305, and is formed at a film thickness of 40 nm.

In addition, the organic compound layer 302 is completed to have a laminate structure by forming an electron transmitting region 306 by co-evaporating the material having electron transporting characteristics, which is used for forming the electron transporting layer 305, with donor molecules. Note that TMB and $Alq_3$ are formed here at a film thickness of 5 nm by co-evaporation as the electron transmitting region 306, similar to FIG. 2B.

A second electrode (cathode) 307 is formed lastly, thus completing the light emitting element. Note that the second electrode (cathode) 307 formed here is formed by laminating 20 nm of Al, similar to the case explained in FIG. 2B.

Embodiment Mode 3

Figure 4A:
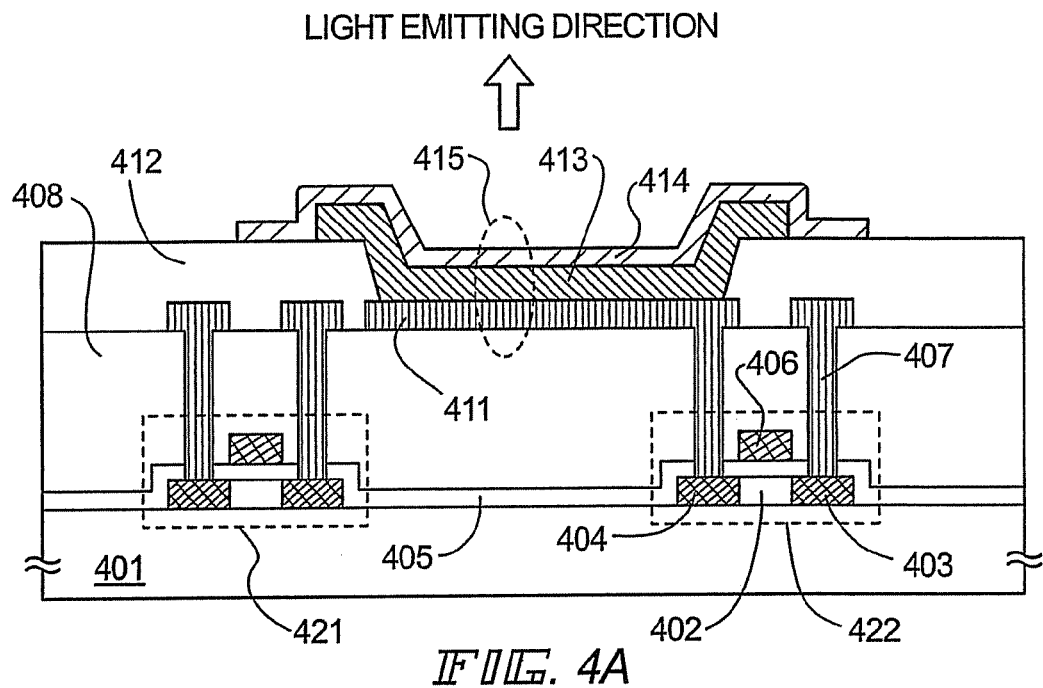
FIGS. 4A and 4B are diagrams for explaining the element structure of an upward-emission type light emitting device.
Figure 4B:
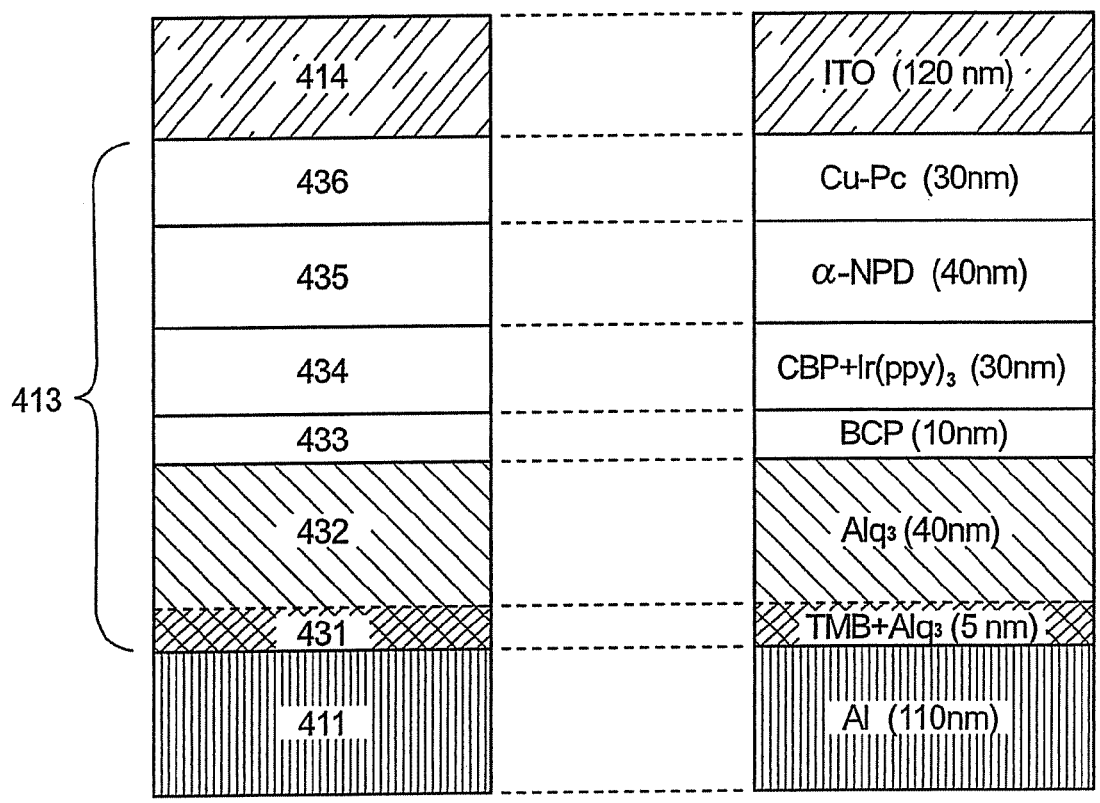

A light emitting device in which the element structure of a light emitting element differs from that of the light emitting device described in Embodiment Mode 2 is explained in Embodiment Mode 3 using FIGS. 4A and 4B. FIG. 4A is a diagram showing the cross sectional structure of a pixel portion of the light emitting device, and FIG. 4B is a diagram showing the element structure of the light emitting element. Specifically, an upward-emission type element structure is explained for a case in which one electrode is electrically connected to an electric current control TFT, and another electrode, formed sandwiching an organic compound layer therebetween, is an anode made from a material through which light passes.

Note that the light emitting device in Embodiment Mode 3 has an electric current control TFT 422 and a switching TFT 421 on a substrate 401, similar to that of Embodiment Mode 2, and it is preferable that the electric current control TFT 422 be formed by an n-channel TFT in Embodiment Mode 3.

An interlayer insulating film 408 is formed covering the electric current control TFT 422 and the switching TFT 421. A wiring 407 that is electrically connected to a source region 403 of the electric current control TFT 422, and a first electrode 411 that is electrically connected to a drain region 404 of the electric current control TFT 422 are then formed on the interlayer insulating film 408. Note that the first electrode 411 is formed so as to become a cathode in Embodiment Mode 3. An insulating layer 412 is formed covering an edge portion of the first electrode 411, the wiring 407, and the like. The first electrode (cathode) 411 thus uses a material having a small work function that functions as a cathode. Note that it is preferable to use a conductive material having light-shielding characteristics and having high reflectivity as the material for forming the first electrode (cathode) 411. Reference numerals 402 denotes a channel formation region, 405 denotes a gate insulating film, and 406 denotes a gate electrode.

Further, an organic compound layer 413 is formed on the first electrode (anode) 411, and a second electrode 414 which becomes an anode is formed on the organic compound layer 413, thus completing a light emitting element 415. Note that it is necessary that the second electrode (anode) 414 be formed having light transmitting characteristics in Embodiment Mode 3, and therefore the second electrode (anode) 414 is formed by a transparent conductive film through which light (visible light) passes.

The element structure becomes an upper surface emission structure in Embodiment Mode 3 in which light developed due to carrier recombination in the organic compound layer 413 is emitted from the second electrode (anode) 414 side because a transparent conductive film is used as the second electrode (anode) 414. Note that it is preferable to form the first electrode (cathode) 411 by a material having light-shielding characteristics in Embodiment Mode 3.

The element structure of the light emitting element of the light emitting device of FIG. 4A is explained next in detail using FIG. 4B. In particular, the structure of an element formed by using low molecular-based compounds in the organic compound layer is explained.

The first electrode (cathode) 411 is formed by a conductive film having light-shielding characteristics. The first electrode (cathode) 411 is an electrode that is electrically connected to the electric current control TFT 422 in Embodiment Mode 3 as shown in FIG. 4A, and is formed by Al formed at a film thickness of 110 nm. Note that evaporation is used in film formation.

The organic compound layer 413 is then formed on the first electrode (cathode) 411, and an electron transmitting region 431 is formed first. Note that the electron transmitting region 431 is formed by co-evaporating donor molecules containing the molecular skeletons shown by the structural formulae (D1) to (D7) in at least a portion therein, and a material having electron transporting characteristics and used for forming an electron transporting layer 432, which is formed next. The electron transmitting region 431 is formed in Embodiment Mode 3 by co-evaporating TMB and $Alq_3$ at a film thickness of 5 nm.

The electron transporting layer 432 which functions to increase the electron transporting characteristics is formed next. The electron transporting layer 432 is formed by an electron transporting material having electron accepting characteristics. A film of $Alq_3$ is formed at a film thickness of 40 nm as the electron transporting layer 432 in Embodiment Mode 3 by evaporation.

A blocking layer 433 is formed next. The blocking layer 433, also referred to as a hole inhibiting layer, is a layer for preventing useless electric current, that is not involved in recombination, from flowing due to holes injected to a light emitting layer 434 passing through the electron transporting layer 432 and reaching the first electrode (cathode) 411. BCP is formed at a film thickness of 10 nm by evaporation as the blocking layer 433 in Embodiment Mode 3.

The light emitting layer 434 is formed next. Holes and electrons recombine in the light emitting layer 434 in Embodiment Mode 3, and luminescence develops. Note that the light emitting layer 434 is formed at a film thickness of 30 nm by co-evaporation using CBP as a host material having hole transporting characteristics, and the light emitting organic compound $Ir(ppy)_3$.

A hole transporting layer 435 is formed next from a material having superior hole transporting characteristics. A 40 nm thick film of α-NPD is formed here by evaporation.

A hole injecting layer 436 is formed lastly, thus completing the organic compound layer 413 having a laminate structure. Note that the hole injecting layer 436 functions to increase the injecting characteristics of holes from the anode. Cu-Pc is formed at a film thickness of 30 nm as the hole injecting layer 436 in Embodiment Mode 3. Note that evaporation is used in the formation.

The second electrode 414 which becomes an anode is formed next. In the present invention, the second electrode (anode) 414 is an electrode through which light developed in the organic compound layer 413 passes, and therefore is formed by a material having light transmitting characteristics. Further, the second electrode (anode) 414 is an electrode that injects holes into the organic compound layer 413, and therefore it is necessary to form the second electrode (anode) 414 by a material having a high work function. Note that, in this embodiment mode, an ITO film or a transparent conductive film in which 2 to 20% zinc oxide (ZnO) is mixed into indium oxide is used as the material for forming the second electrode (anode) 414, and is formed by sputtering to a film thickness of 100 nm. Note that other known materials (such as IZO or materials made form indium oxide and zinc oxide) can also be used for forming the second electrode (cathode) 414, provided that they are transparent conductive films having a large work function.

Figure 5:
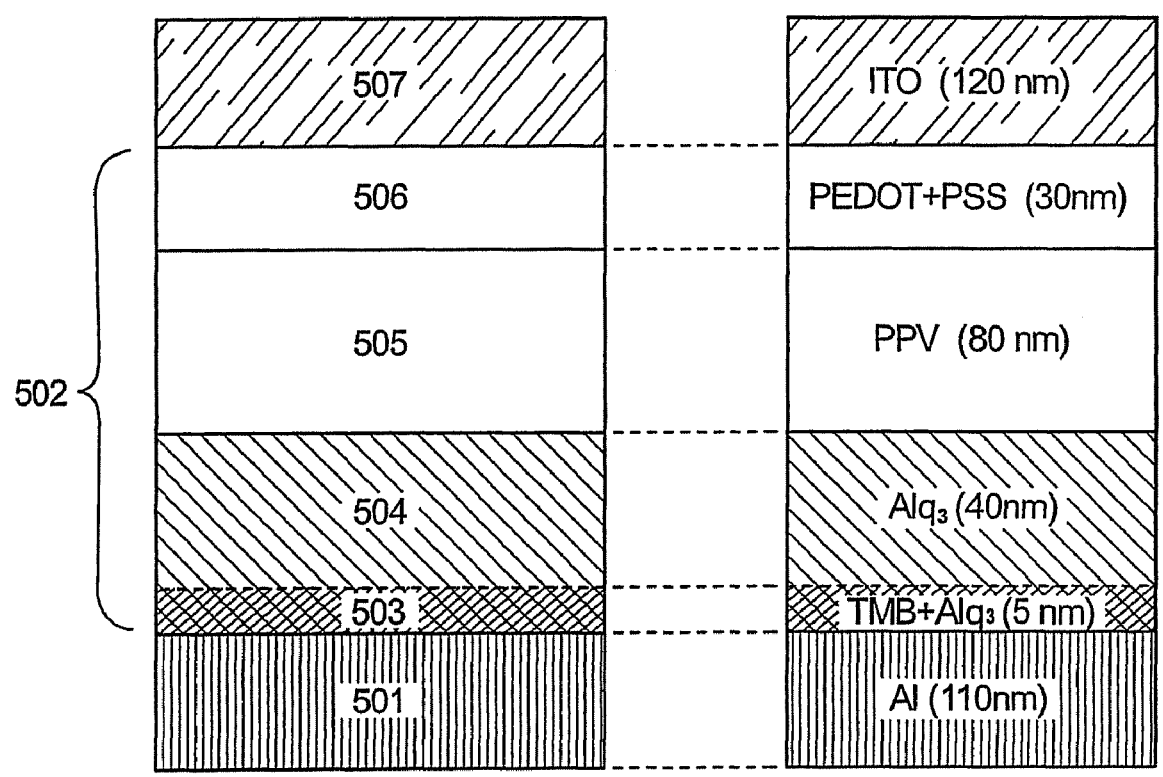
FIG. 5 is a diagram for explaining the element structure of an upward-emission type light emitting device.

In addition, the element structure for a case of forming the organic compound layer by using high molecular-based compounds and low molecular-based compounds in the light emitting device having the element structure of Embodiment Mode 3 is explained using FIG. 5.

A first electrode (cathode) 501 is formed by a conductive film having light-shielding characteristics, similar to that of FIG. 4B. However, an organic compound layer 502 formed on the first electrode (cathode) 501 differs from that of FIG. 4B. The organic compound layer 502 is made form a laminate structure of an electron transmitting region 503, an electron transporting layer 504, a light emitting layer 505, and a hole transporting layer 506. Note that a case in which high molecular-based compounds are used in the light emitting layer 505 and the hole transporting layer 506 is explained here.

The electron transmitting region 503 is formed on the first electrode (cathode) 501. Here, as the electron transmitting region 503, TMB and Alq$_3$ are deposited with a film thickness of 5 nm by co-evaporation, similar to that explained in FIG. 4B.

The electron transporting layer 504 is formed next on the electron transmitting region 503. Note that, as the low molecular-based compound, Alq$_3$ is used as a material for forming the electron transporting layer 504 here, and is formed by evaporation to a film thickness of 40 nm.

An application liquid obtained by dissolving PPV in toluene is applied next by spin coating, forming an 80 nm-thick film as the light emitting layer 505.

The hole transporting layer 506 is formed next, thus completing the organic compound layer 502 having a laminate structure. Note that the hole transporting layer 506 is formed in Embodiment Mode 3 by applying an application liquid, obtained by dissolving PEDOT and PSS in water, using spin coating. The hole transporting layer 506 is formed at a film thickness of 30 nm in Embodiment Mode 3.

A second electrode (anode) 507 is formed lastly, thus completing the light emitting element. Note that the second electrode (anode) 507 formed here is formed by forming through sputtering an indium tin oxide (ITO) film or a transparent conductive film in which 2 to 20% zinc oxide (ZnO) is mixed into indium oxide, similar to that shown in FIG. 4B.

Embodiment Mode 4

Figure 6A:
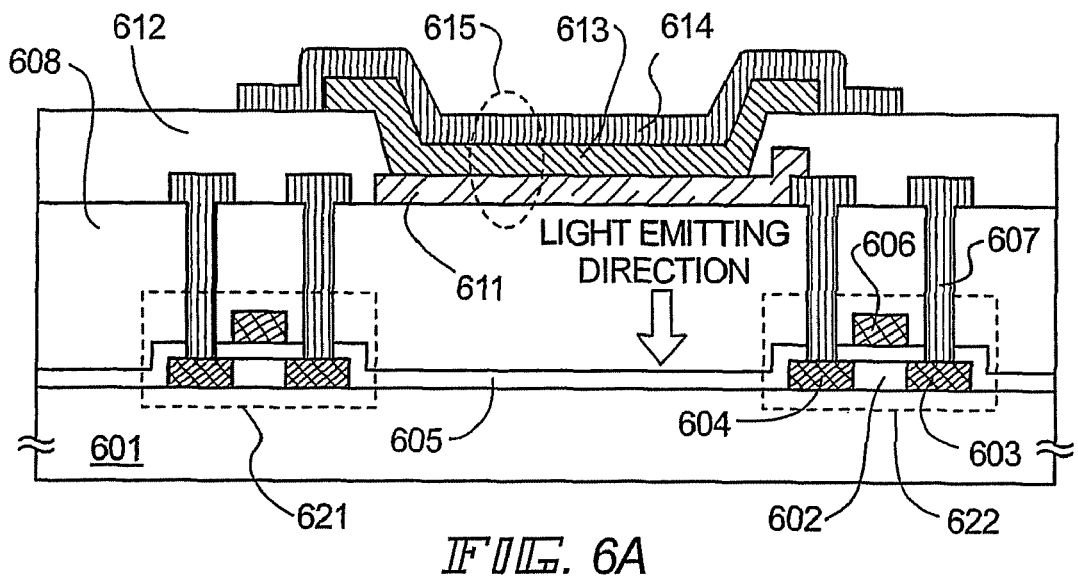
FIGS. 6A and 6B are diagrams for explaining the element structure of a downward-emission type light emitting device.
Figure 6B:
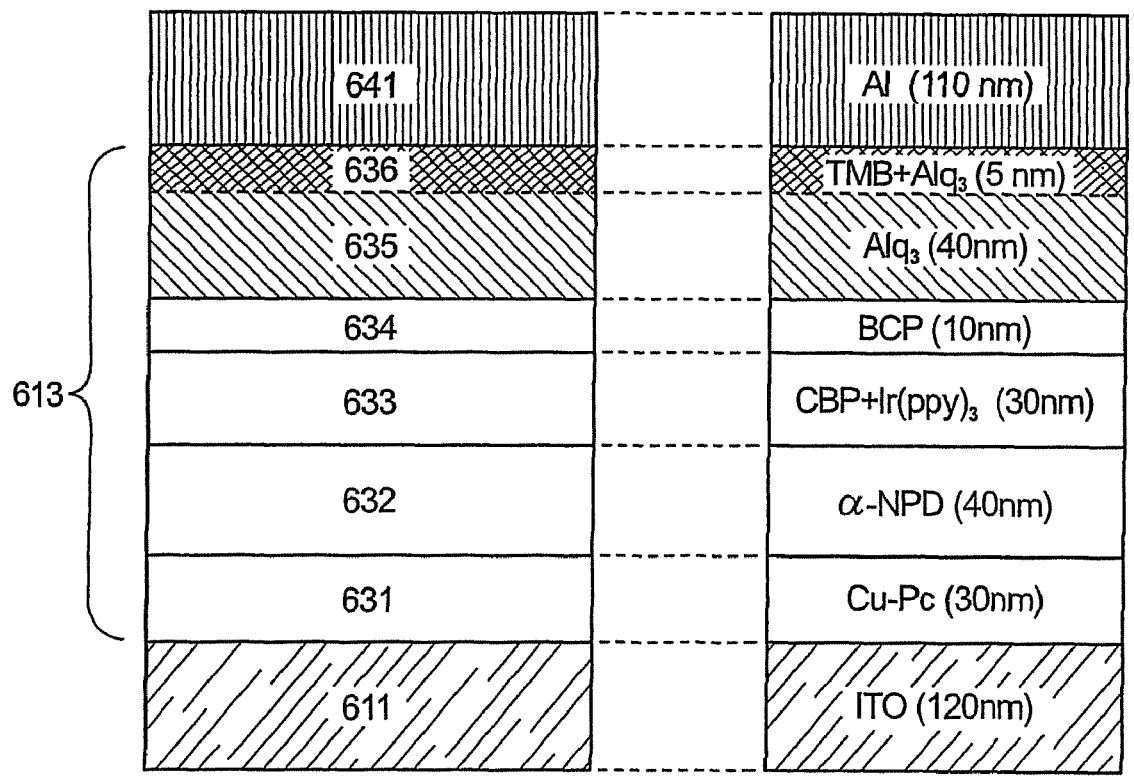

A light emitting device in which the element structure of a light emitting element differs from that disclosed by Embodiment Mode 2 or Embodiment Mode 3 is explained in Embodiment Mode 4 using FIGS. 6A and 6B. Note that FIG. 6A is a diagram showing the cross sectional structure of a pixel portion of the light emitting device, and FIG. 6B is a diagram showing the element structure of the light emitting element. Specifically, a downward-emission element structure for a case in which an electrode that is electrically connected to an electric current control TFT is an anode made from a material having light transmitting characteristics is explained.

Note that an electric current control TFT 622 and a switching TFT 621 are formed on a substrate 601 in the light emitting device of Embodiment Mode 4, similar to Embodiment Mode 2 and Embodiment Mode 3. However, it is preferable that the electric current control TFT 622 be formed by a p-channel TFT in Embodiment Mode 4.

A wiring 607 which is electrically connected to a source region 603 of the is electric current control TFT 622, and a first electrode 611 which is electrically connected to a drain region 604 of the electric current control TFT 622 are formed on an interlayer insulating film 608 formed covering the electric current control TFT 622 and the switching TFT 621. Note that the first electrode 611 is formed so as to become an anode in Embodiment Mode 4. The first electrode (anode) 611 is formed using a material having a large work function and functioning as an anode. An insulating layer 612 is formed covering an edge portion of the first electrode (anode) 611, the wiring 607, and the like. Note that it is preferable to use a conductive material having light transmitting characteristics as the material for forming the first electrode (anode) 611. Reference numeral 602 denotes a channel formation region, 605 denotes a gate insulating film, and 606 denotes a gate electrode.

Further, a glass substrate is used as a substrate having light transmitting characteristics for the substrate 601, but a quartz substrate may also be used.

Furthermore, an organic compound layer 613 is formed on the first electrode (anode) 611, and a light emitting element 615 can be completed by forming a second electrode 614 which becomes a cathode on the organic compound layer 613. Note that it is necessary that the first electrode (anode) 611 be formed so as to have light transmitting characteristics in Embodiment Mode 4, and therefore the first electrode (anode) 611 is formed by a transparent conductive film through which light (visible light) passes. Note also that it is preferable to form the second electrode (cathode) 614 by a material having light-shielding characteristics.

A transparent conductive film is used in the first electrode (anode) 611 in Embodiment Mode 4, and therefore this is a lower surface emission structure in which light developed by carrier recombination in the organic compound layer 613 is emitted from the first electrode (anode) 611 side.

The element structure in the light emitting element of the light emitting device explained in FIG. 6A is explained next in detail using FIG. 6B. In particular, an element structure obtained by using low molecular-based compounds in the organic compound layer is explained.

The first electrode (anode) 611 is formed by a transparent conductive film having light transmitting characteristics. The first electrode (anode) 611 is an electrode that is electrically connected to the electric current control TFT 622 in Embodiment Mode 4, as shown in FIG. 6A, and an indium tin oxide (ITO) film or a transparent conductive film in which 2 to 20% zinc oxide (ZnO) is mixed into indium oxide is used as the material forming the first electrode (anode) 611 in Embodiment Mode 4. The film is formed with a film thickness of 100 nm by sputtering.

The organic compound layer 613 is then formed on the first electrode (anode) 611, and a hole injecting layer 631 functioning to increase the injecting characteristics of holes from the anode is formed first. In Embodiment Mode 4, Cu-Pc is deposited by evaporation at a film thickness of 30 nm as the hole injecting layer 631.

A hole transporting layer 632 is formed next by a material having superior hole transporting characteristics. A 40 nm-thick film of α-NPD is formed here by sputtering.

A light emitting layer 633 is formed next. Holes and electrons recombine in the light emitting layer 633 in Embodiment Mode 4, and light emission occurs. Note that the light emitting layer 633 is formed at a film thickness of 30 nm by co-evaporation using CBP as a host material having hole transporting characteristics and Ir(ppy)$_3$ as the light emitting organic compound.

In addition, a blocking layer 634 is formed. The blocking layer 634 is also referred to as a hole inhibiting layer, and is a layer for preventing useless electric current, that is not involved in recombination, from flowing when holes injected to the light emitting layer 633 pass through an electron transporting layer to reach a cathode. BCP is deposited at a film thickness of 10 nm by evaporation as the blocking layer 634 in Embodiment Mode 4.

An electron transporting layer 635 is then formed. Note that the electron transporting layer 635 is formed by an electron transporting material having electron accepting characteristics. A 40 nm-thick film of Alq$_3$ is formed by evaporation in Embodiment Mode 4 as the electron transporting layer 635.

In addition, an electron transmitting region 636 can be formed by co-evaporation of a material having electron transporting characteristics and donor molecules, and the organic compound layer 613 having a laminate structure is thus completed. Note that the electron transmitting region 636 is formed by co-evaporation of donor molecules containing the molecular skeletons shown by structural formulae (D1) to (D7) in at least a portion therein, and a material having electron transporting characteristics. As the electron transmitting region 636, TMB and Alq$_3$ are deposited in Embodiment Mode 4 having a film thickness of 5 nm by co-evaporation.

The second electrode 614 which becomes a cathode is formed next. The second electrode (cathode) 614 is an electrode for injecting electrons into the organic compound layer 613 in the present invention, and therefore it is necessary that it be formed by using a material having a small work function. The second electrode (cathode) 614 is formed from Al with a film thickness of 110 nm in Embodiment Mode 4. Note that evaporation is used here in the film formation.

Figure 7:
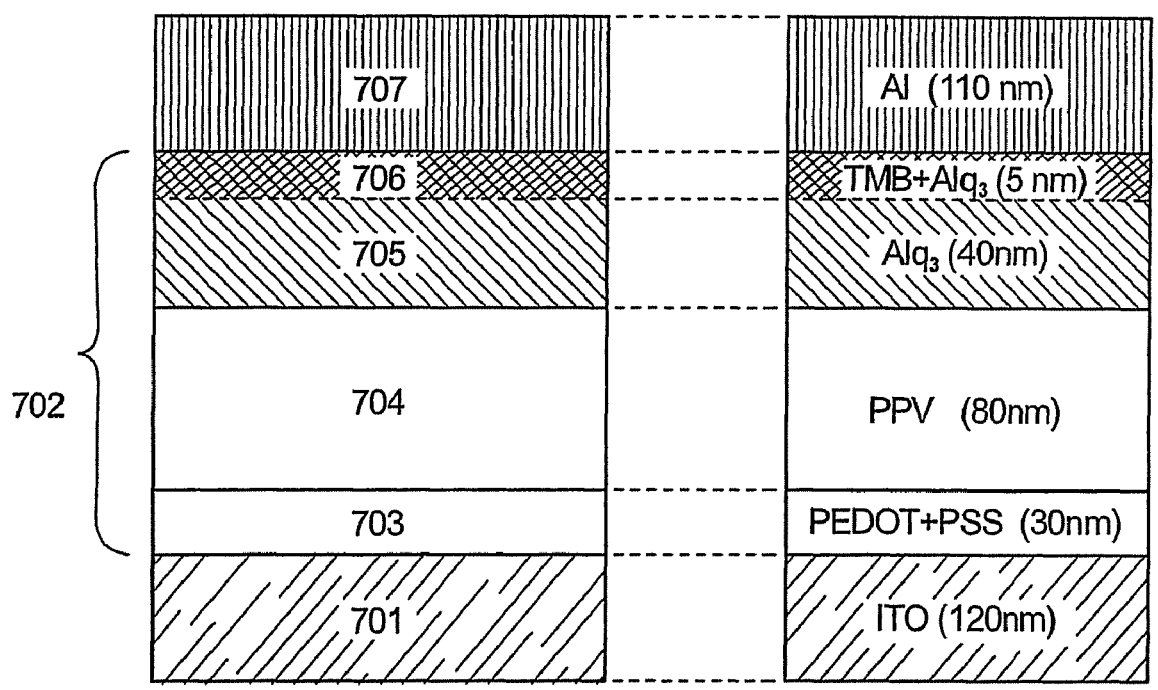
FIG. 7 is a diagram for explaining the element structure of a downward-emission type light emitting device.

In addition, the element structure for a case of using high molecular-based compounds and low molecular-based compounds in the organic compound layer in the light emitting device having the element structure of Embodiment Mode 4 is explained using FIG. 7.

A first electrode (anode) 701 is formed from a transparent conductive film having light transmitting characteristics, similar to FIG. 6B. However, an organic compound layer 702 formed on the first electrode (anode) 701 is made from a laminate structure of a hole transporting layer 703, a light emitting layer 704, an electron transporting layer 705, and an electron transmitting region 706. Note that a case of using high molecular-based compounds in the hole transporting layer 703 and the light emitting layer 704 is explained here.

The electron transporting layer 703 is formed on the first electrode (anode) 701. A film formed by application using spin coating of an application liquid, obtained by dissolving PEDOT and PSS in water, is used here as the hole transporting layer 703. Note that the hole transporting layer 703 is formed at a film thickness of 30 nm in Embodiment Mode 4.

The light emitting layer 704 is formed next on the hole transporting layer 703. Note that a film formed by application using spin coating of an application liquid, obtained by dissolving PAT in toluene, is used here with a film thickness of 80 nm as the light emitting layer 704.

The electron transporting layer 705 is formed next on the light emitting layer 704. Note that a film formed by evaporation using Alq$_3$ as the low molecular-based compound that is a material for forming the electron transporting layer 705 is used here with a film thickness of 40 μm as the electron transporting layer 705.

The electron transmitting region 706 is formed next. The electron transmitting region 706 is formed here at a film thickness of 5 nm by co-evaporating TMB and Alq$_3$, similar to that explained in FIG. 6B.

A second electrode (cathode) 707 is formed lastly, completing the light emitting element. Note that the second electrode (cathode) 707 formed here is formed by Al at a film thickness of 110 nm, similar to that shown in FIG. 6B.

Embodiment Mode 5

Figure 8A:
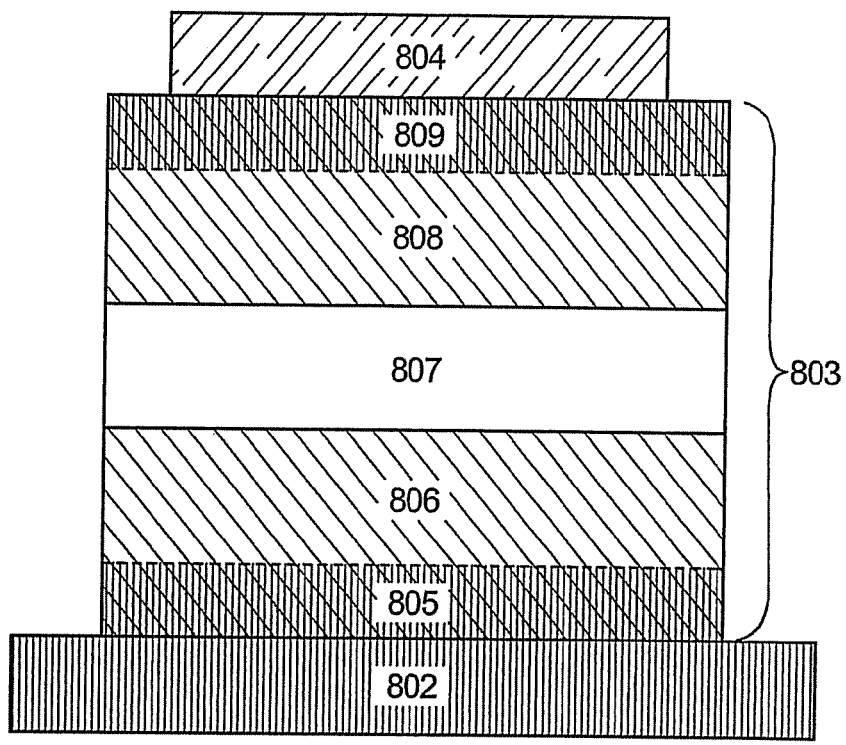
FIGS. 8A and 8B are diagrams for explaining the element structure of a light emitting device of the present invention.

An element structure of a light emitting element having a hole transmitting region 805 in a region where a first electrode 802 that becomes an anode is brought into contact with an organic compound layer 803, and having an electron transmitting region 809 in a region where a second electrode 804 that becomes a cathode is brought into contact with the organic compound layer 803, as shown in FIG. 8A, is explained next in Embodiment Mode 5. Reference numeral 806 denotes a hole transporting layer, 807 denotes a light emitting layer, and 808 denotes an electron transporting layer.

Figure 8B:
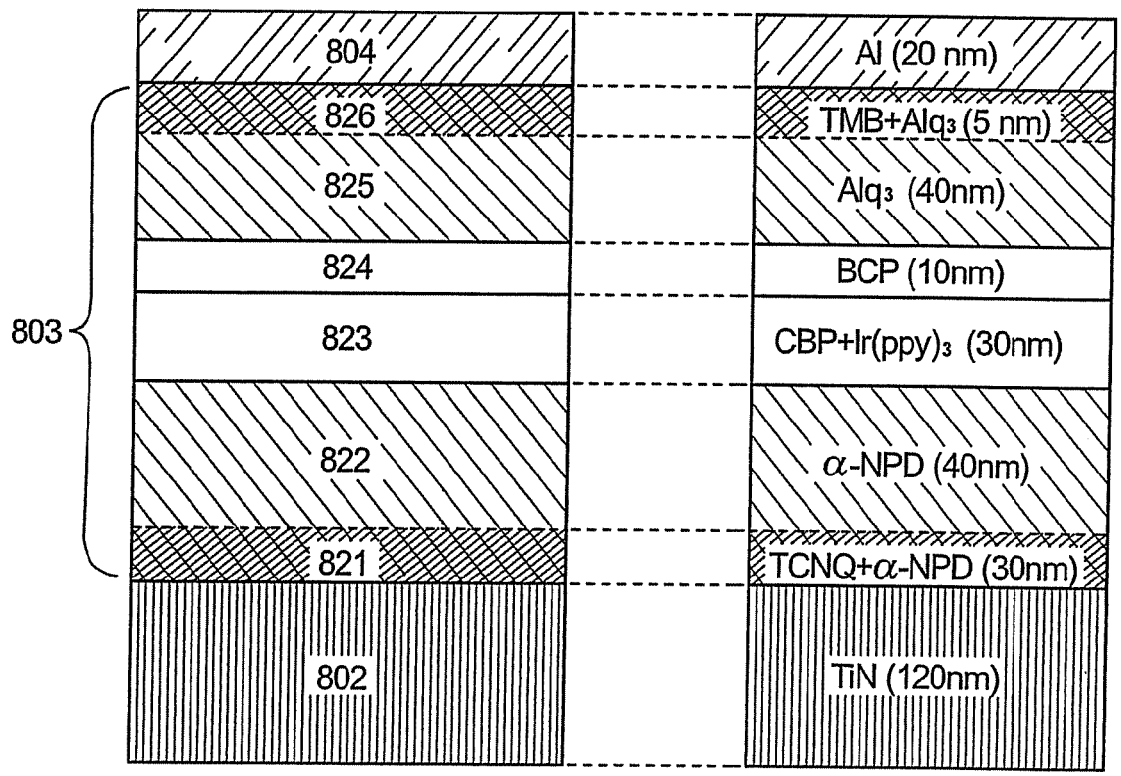

FIG. 8B shows a structure in which the upward-emission light emitting element explained in Embodiment Mode 2 additionally has a hole transmitting region 821 in a region at which the first electrode 802, which is the anode, and the organic compound layer 803 contact.

That is, the hole transmitting region 821 is formed on the first electrode (anode) 802 at a film thickness of 30 nm by co-evaporating TCNQ, which is an acceptor molecule, and α-NPD, which is a material having hole transporting characteristics.

A hole transporting layer 822 is then formed on the hole transmitting region 821 by forming a 40 nm-thick film of α-NPD using evaporation.

Note that a light emitting layer 823, a blocking layer 824, an electron transporting layer 825, and an electron transmitting region 826 are formed on the hole transporting layer 822, similar to the structure shown in FIG. 2B, thus forming the organic compound layer 803 having a laminate structure.

The second electrode (cathode) 804 is formed lastly by depositing Al at a film thickness of 20 nm, thus forming the upward-emission light emitting device having the hole transmitting region 821 and the electron transmitting region 826.

Figure 9A:
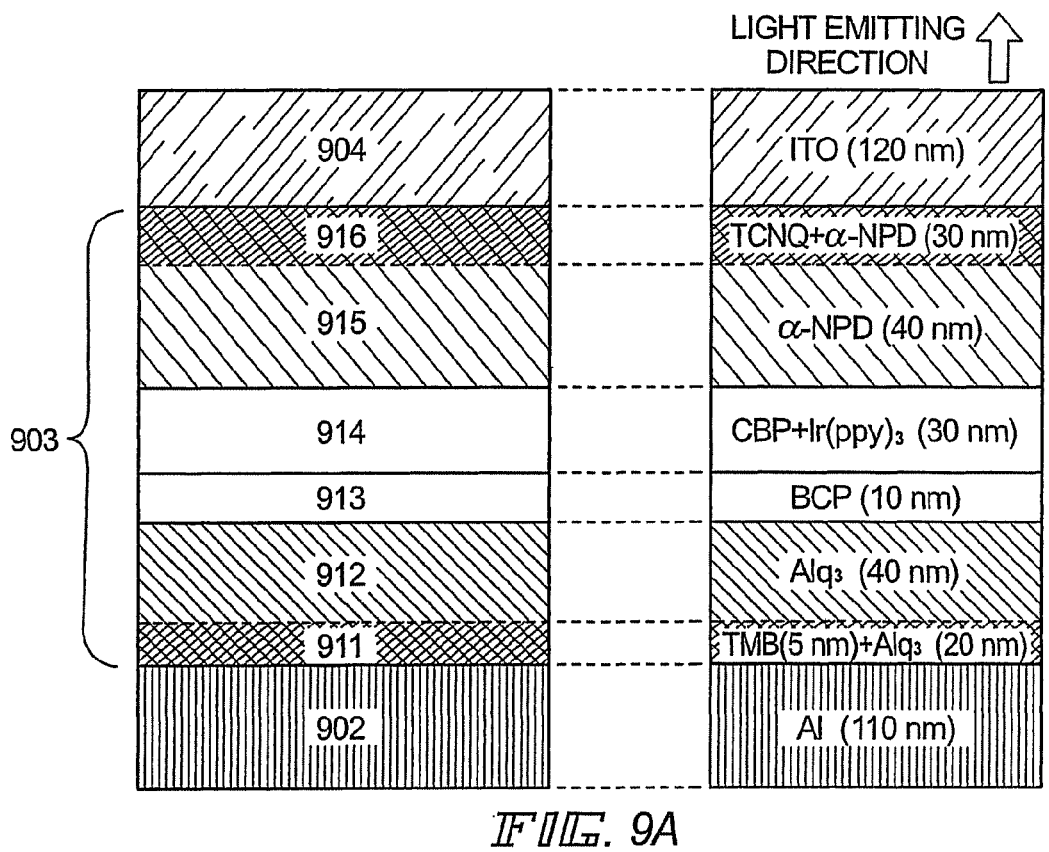
FIGS. 9A and 9B are diagrams for explaining the element structure of a light emitting device of the present invention.

The element structure of a light emitting element, in which the light emitting element structure explained in Embodiment Mode 3 has further a hole transmitting region 916 in a region at which a second electrode 904, which is an anode, and an organic compound layer 903 contact, as shown in FIG. 9A, is explained next.

Note that an electron transmitting region 911, an electron transporting layer 912, a blocking layer 913, a light emitting layer 914, and a hole transporting layer 915 are formed on a first electrode 902, which is obtained by forming a 110 nm-thick film of Al, similar to the structure shown in FIG. 4B.

The hole transmitting region 916 is formed at a film thickness of 30 nm on the hole transporting layer 915 by co-evaporation using TCNQ as an acceptor molecule, and α-NPD as a hole transporting material.

The second electrode (anode) 904 is formed lastly by depositing ITO with a film thickness of 120 nm, thus forming the upward-emission light emitting device having the electron transmitting region 911 and the hole transmitting region 916.

Figure 9B:
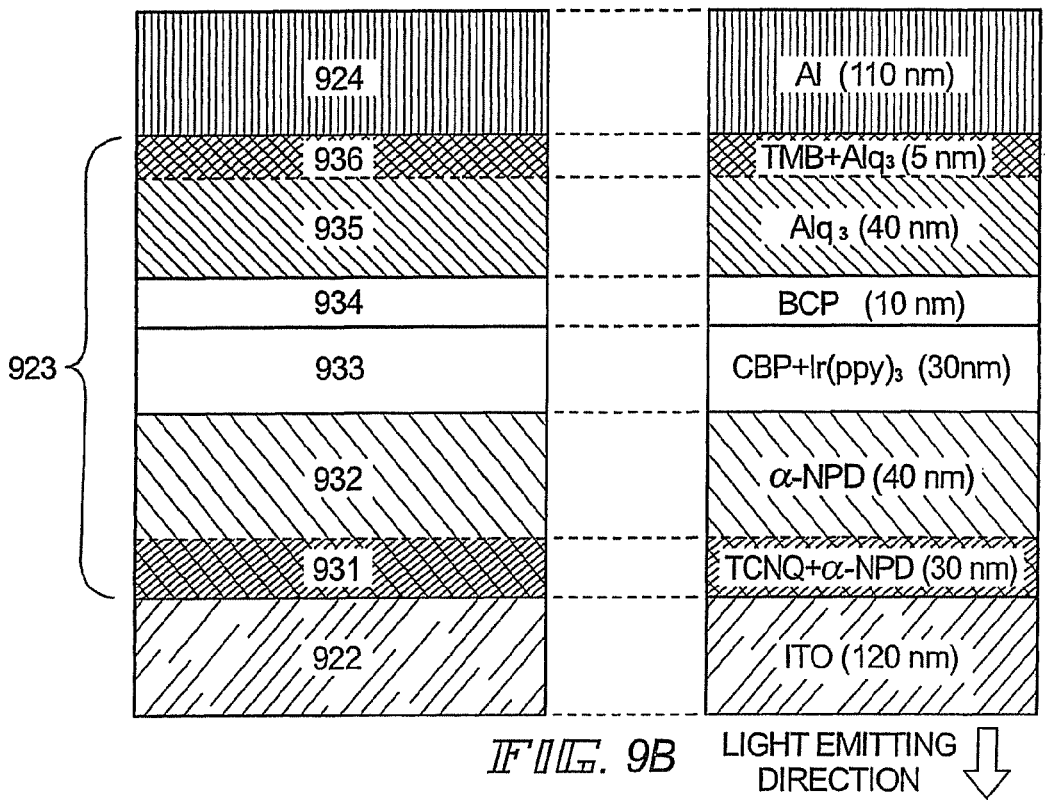
Figure 12A:
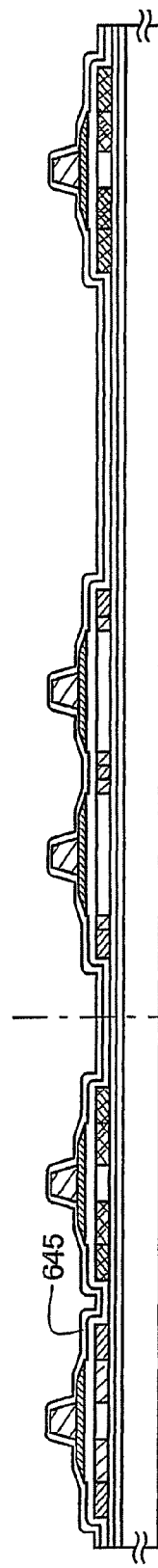
FIGS. 12A to 12C are diagrams for explaining the process of manufacturing the light emitting device of the present invention.
Figure 12B:
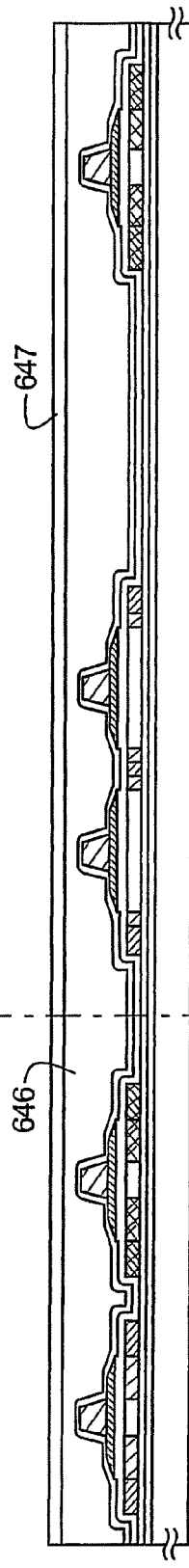
Figure 12C:
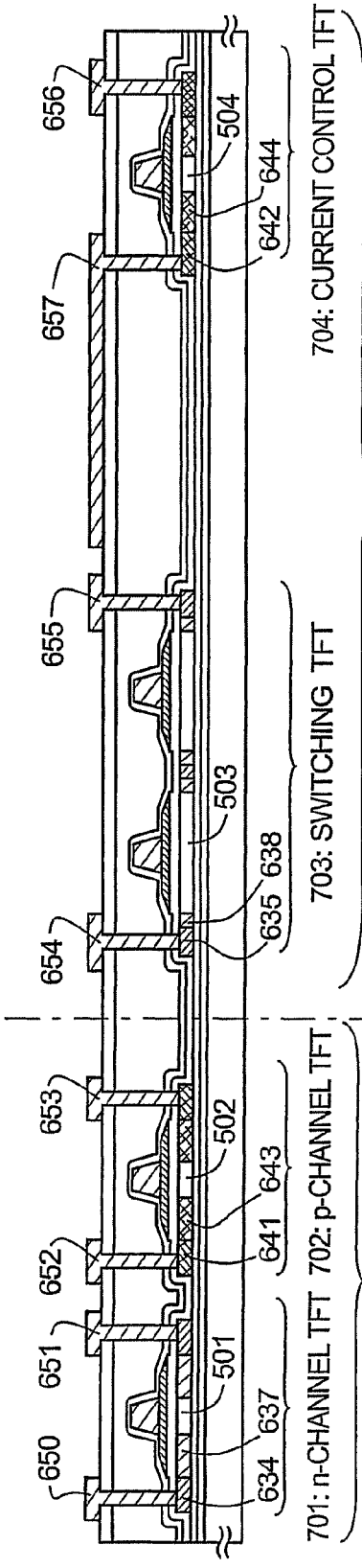

The element structure of a light emitting element, in which the downward-emission light emitting element structure explained in Embodiment Mode 4 has further a hole transmitting region 931 in a region at which a first electrode 922, which is an anode, and an organic compound layer 923 contact, as shown in FIG. 9B, is explained next.

That is, the hole transmitting region 931 is formed at a film thickness of 30 nm on the first electrode (anode) 922, obtained by forming 120 nm-thick film of ITO, by co-evaporation using TCNQ as an acceptor molecule, and α-NPD as a material having hole transporting characteristics.

A hole transporting layer 932 is formed on the hole transmitting region 931 by evaporating α-NPD to a film thickness of 40 nm.

Note that a light emitting layer 933, a blocking layer 934, an electron transporting layer 935, and an electron transmitting region 936 are formed on the hole transporting layer 932, similar to the structure shown in FIG. 6B, thus forming the organic compound layer 923 having a laminate structure.

A second electrode (cathode) 924 is formed lastly by forming a 110 nm-thick film of Al, thus completing the upward-emission light emitting device having the hole transmitting region 931 and the electron transmitting region 936.

Embodiment Mode 6

This embodiment mode will be described with references to FIGS. 10A to 13B. Here, a detailed description will be given on a method of manufacturing a pixel portion and TFTs (n-channel TFTs and p-channel TFTs) of a driving circuit that are provided in the periphery of the pixel portion are formed on the same substrate at the same time. In this embodiment mode, the light emitting element having the element structure shown in Embodiment Mode 2 is formed.

The base insulating film 601 is formed on the substrate 600 to obtain the first semiconductor film having a crystal structure. Subsequently, isolated in island-shape semiconductor layers 602 to 605 are formed by conducting etching treatment to the desired shape.

As a substrate 600, the glass substrate (#1737) is used. As a base insulating film 601, a silicon oxynitride film 601a is formed as a lower layer of a base insulating film on the silicon oxide film by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film 601b is formed as an upper layer of the base insulating film by plasma CVD at a temperature of 400° C. using $SiH_4$ and $N_2O$ as material gas (the composition ratio of the silicon oxynitride film: Si=32%, O=59%, N=7%, H=2%). The silicon oxynitride film 601b has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film is 54 nm (preferably 25 to 80 nm) in thickness.

A base film 601 in this embodiment mode has a two-layer structure. However, the base insulating film may be a single layer or more than two layers of insulating films. The material of the semiconductor film is not limited but it is preferable to form the semiconductor film from silicon or a silicon germanium alloy ($Si_xG_{1-x}$(X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dose to $2\times10^{12}/cm^2$.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time. This embodiment mode employs a crystallization technique in which nickel is used as a metal element for accelerating crystallization of silicon. However, other known crystallization techniques, solid phase growth and laser crystallization, for example, may be employed.

Subsequently, after the oxide film of the surface of the silicon film having a crystal structure was removed by dilute hydrofluoric acid or the like, the irradiation of the first laser beam (XeCl: wavelength 308 nm) for enhancing the crystallization ratio and repairing the defaults remained within the crystal grain is performed in the air, or in the oxygen atmosphere. It is preferable that a solid-state laser of a continuous oscillation or a pulse oscillation, a gas laser, or metallic laser is used. Note that, as the solid-state laser, there may be given a YAG laser of a continuous oscillation or a pulse oscillation, a $YVO_4$ laser, a YLF laser, a $YAlO_3$ laser, a glass laser, a ruby laser, an alexandrite laser, a Ti: sapphire laser, and the like. As a the gas laser, there may be given a excimer laser of continuous oscillation or pulse oscillation, Ar laser, Kr laser, $CO_2$ laser, or the like. And as the metallic laser, there may be given a helium cadmium laser of continuous oscillation or pulse oscillation, a copper vapor laser, or a gold vapor laser. The laser beam may be used by converting into the second harmonic wave and the third harmonic wave by a nonlinear optical element. If a pulse laser beam is used, it is preferable that 10-10 kHz of repeated frequency and the relevant laser beam is condensed at 100-150 $mJ/cm^2$ by an optical system, irradiated with overlap ratio of 50 to 98% and it may be made it scan the surface of the silicon film. Here, the irradiation of the first laser beam is performed at repeated frequency of 30 Hz, 393 $mJ/cm^2$ of energy density in the air. At this moment, if a continuous oscillation laser is used, about 0.01 to 100 $MW/cm^2$ (preferably 0.1 to 10 $MW/cm^2$) is necessary for the energy density of laser beam. The substrate is relatively moved to the laser beam at a speed of about 0.5 to 2000 cm/s. It should be noted that since it is performed in the air, or in the oxygen atmosphere, an oxide film is formed on the surface by the irradiation of the first laser beam.

After removing an oxide film formed during irradiating the laser light by using hydrofluoric acid, the second laser light is irradiated in a nitrogen atmosphere or vacuum atmosphere to smooth the surface of the semiconductor film. Above-described solid laser of the continuous laser or the pulse oscillation laser, the gas laser, or the metal laser may be used in that case. The laser light (the second laser light) can be used by converting into the second higher harmonic or the third higher harmonics by nonlinear optical element. Note that the energy density of the second laser light is made larger than the energy density of the first laser light.

Laser light irradiation at this point is very important because it is used to form an oxide film to prevent doping of the silicon film having a crystal structure with a rare gas element in later film formation by sputtering and because it enhances the gettering effect. The oxide film formed by this laser light irradiation and an oxide film formed by treating the surface with ozone water for 120 seconds together make a barrier layer that has a thickness of 1 to 5 nm in total.

Next, an amorphous silicon film containing argon is formed on the barrier layer by sputtering to serve as a gettering site. The thickness of the amorphous silicon film is 150 nm. The conditions for forming the amorphous silicon film here include setting the film formation pressure to 0.3 Pa, the gas (Ar) flow rate to 50 sccm, the film formation power to 3 kW, and the substrate temperature to 150° C. The atomic concentration of argon contained in the amorphous silicon film formed under the above conditions is $3\times10^{20}$ to $6\times10^{20}$/cm$^3$ and the atomic concentration of oxygen thereof is $1\times10^{19}$ to $3\times10^{19}$/cm$^3$. Thereafter, heat treatment is conducted in a lamp annealing apparatus at 650° C. for 3 minutes for gettering.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also referred to as a polysilicon film) using ozone water. A resist mask is then formed and the silicon film is etched to form island-like semiconductor layers separated from one another and having desired shapes. After the semiconductor layers are formed, the resist mask is removed.

Also, after forming a semiconductor layer, in order to control the threshold (Vth) of the TFTs, the semiconductor layers may be doped with an impurity element that gives the p-type or n-type conductivity. Impurity elements known to give a semiconductor the p-type conductivity are Group 13 elements in the periodic table, such as boron (B), aluminum (Al), and gallium (Ga). Impurity elements known to give a semiconductor the n type conductivity are Group 15 elements in the periodic table, such as phosphorus (P) and arsenic (As).

Next, a thin oxide film is formed from ozone water on the surface of the obtained silicon film having a crystal structure (also called a polysilicon film). A resist mask is formed for etching to obtain semiconductor layers 602 to 605 having desired shapes and separated from one another like islands. After the semiconductor layers are obtained, the resist mask is removed. The oxide film is removed by an etchant containing fluoric acid, and at the same time, the surface of the silicon film is washed. Then, an insulating film mainly containing silicon is formed to serve as a gate insulating film 607. For forming the gate insulating film 607, a lamination film formed by a silicon oxide film and silicon nitride film which are formed by sputtering method with Si as a target, a silicon oxynitride film which is formed by plasma CVD method, and silicon oxide film may be used. The gate insulating film here is a silicon oxynitride film (composition ratio: Si=32%, O=59%, N=7%, H=2%) formed by plasma CVD to have a thickness of 115 nm.

As shown in FIG. 10A, a first conductive film 608 with a thickness of 20 to 100 nm and a second conductive film 609 with a thickness of 100 to 400 nm are layered on the gate insulating film 607. In this embodiment mode, a 50 nm thick tantalum nitride film and a 370 nm thick tungsten film are layered on the gate insulating film 607 in the order stated.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

As shown in FIG. 10B, resist masks 610 to 613 are formed by light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Under the first etching conditions, the rate of etching the W film is 200.39 nm/min., and the rate of etching the TaN film is 80.32 nm/min. The selective ratio of W to TaN is therefore about 2.5. The W film is tapered under the first etching conditions at an angle of about 26°. Thereafter, the first etching conditions are switched to the second etching conditions without removing the resist masks 610 to 613. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions including the use of a mixture of $CF_4$ and $Cl_2$, the TaN film and the W film are etched to about the same degree. The rate of etching the W film is 58.97 nm/min. and the rate of etching the TaN film is 66.43 nm/min. under the second etching conditions. In order to etch the films without leaving any residue on the gate insulating film, the etching time is prolonged by approximately 10 to 20%.

In the first etching treatment, first conductive layers and second conductive layers are tapered around the edges by forming the resist masks into proper shapes and by the effect of the bias voltage applied to the substrate side. The angle of the tapered portions may be 15 to 45°.

The first shape conductive layers 615 to 618 (the first conductive layers 615a to 618a and the second conductive layers 615b to 618b) are formed that is consisted of the first conductive layer and the second conductive layer by the first etching treatment. The insulating film 607 to be a gate insulating film is etched 10 to 20 nm, to form a gate insulating film 620 having a region becoming thin where the first shape conductive layers 615 to 618 do not overlap.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 n/min, an etching rate to TaN is 32.1 nm/min, a selection ratio of W to TaN is 7.1, an etching rate to SiON that is the insulating film 620 is 33.7 nm/min, and a selection ratio of W to SiON is 6.83. In the case where $SF_6$ is used as the etching gas, the selection ratio with respect to the insulating film 620 is high as described above. Thus, reduction in the film thickness can be suppressed. In this embodiment, the film thickness of the insulating film 620 is reduced by only about 8 nm.

By the second etching process, the taper angle of W becomes 70°. By the second etching process, second conductive layers 621b to 624b are formed. On the other hand, the first conductive layers are hardly etched to become first conductive layers 621a to 624a. Note that the first conductive layers 621a to 624a have substantially the same size as the first conductive layers 615a to 615a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer is structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 Mhz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 1A. The doping process may be conducted by ion doping or ion implantation. Ion doping is conducted with the conditions of a dosage of $1.5\times10^{14}$ atoms/cm$^2$ and an accelerating voltage of 60 to 100 keV. As an impurity element imparting n-type conductivity, phosphorus (P) or arsenic (As) is typically used. In this case, first conductive layers and second conductive layers 621 to 624 become masks against the impurity element imparting n-type conductivity, and first impurity regions 626 to 629 are formed in a self-aligning manner. The impurity element imparting n-type conductivity is added to the first impurity regions 626 to 629 in a concentration range of $1\times10^{16}$ to $1\times10^{17}$/cm$^3$. Here, the region having the same concentration range as the first impurity region is also called an n⁻ region.

Note that although the first doping process is performed after the removal of the masks made of resist in this embodiment, the first doping process may be performed without removing the masks made of resist.

Subsequently, as shown in FIG. 11B, masks 631 to 633 made of resist are formed, and a second doping process is conducted. The mask 631 is a mask for protecting a channel forming region and a periphery thereof of a semiconductor layer forming a p-channel TFT of a driver circuit, the mask 632 is a mask for protecting a channel forming region and a periphery thereof of a semiconductor layer forming a TFT of a pixel portion.

With the ion doping conditions in the second doping process: a dosage of $1.5\times10^{15}$ atoms/cm$^2$; and an accelerating voltage of 60 to 100 keV, phosphorus (P) is doped. Here, impurity regions are formed in the respective semiconductor layers in a self-aligning manner with the second conductive layer 621b as masks. Of course, phosphorus is not added to the regions covered by the masks 631 to 633. Thus, second impurity regions 634 and 635 and a third impurity region 637 are formed. The impurity element imparting n-type conductivity is added to the second impurity regions 634 and 635 in a concentration range of $1\times10^{20}$ to $1\times10^{21}$/cm$^3$. Here, the region having the same concentration range as the second impurity region is also called an n⁺ region.

Further, the third impurity region is formed at a lower concentration than that in the second impurity region by the first conductive layer, and is added with the impurity element imparting n-type conductivity in a concentration range of $1\times10^{18}$ to $10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n⁻ region. Furthermore, the regions is covered by the mask 632 are not added with the impurity element in the second doping process, and become first impurity region 638.

Next, after the masks 631 to 633 made of resist are removed, masks 639 and 640 made of resist are newly formed, and a third doping process is conducted as shown in FIG. 11C.

In the driver circuit, by the third doping process as described above, fourth impurity regions 641 and 642, and fifth impurity regions 643 and 644 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 641 and 642 in a concentration range of $1\times10^{20}$ to $1\times10^{21}$/cm$^3$. Note that, in the fourth impurity regions 641 and 642, phosphorus (P) has been added in the preceding step (n⁻ region), but the impurity element imparting p-type conductivity is added at a concentration that is 1.5 to 3 times as high as that of phosphorus. Thus, the fourth impurity regions 641 and 642 have a p-type conductivity. Here, the region having the same concentration range as the fourth impurity region is also called a p⁺ region.

Further, fifth impurity regions 643 and 644 are formed in regions overlapping the tapered portion of the second conductive layers 622a and 624a, and are added with the impurity element imparting p-type conductivity in a concentration range of $1\times10^{18}$ to $1\times10^{20}$/cm$^3$. Here, the region having the same concentration range as the fifth impurity region is also called a p⁻ region.

Through the above-described steps, the impurity regions having n-type or p-type conductivity are formed in the respective semiconductor layers. The conductive layers 621 to 624 become gate electrodes of a TFT.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment mode, a step of forming the insulating film may be conducted after the activation is conducted.

Next, a first interlayer insulating film 645 is formed of a silicon nitride film, and heat treatment (300 to 550° C. for 1 to 12 hours) is performed, thereby conducting a step of hydrogenating the semiconductor layers. (FIG. 12A) The first interlayer insulating film 645 may be a lamination structure consisting of the silicon nitride oxide film and the silicon nitride film formed by the plasma CVD method. This step is a step of terminating dangling bonds of the semiconductor layers by hydrogen contained in the first interlayer insulating film 645. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 646 is formed from an organic insulating material on the first interlayer insulating film 645. In this embodiment, an acrylic resin film with a thickness of 1.6 μm is formed.

Furthermore, in order to prevent degassing such as oxygen, emission of moisture, and the like, generated from the inside of a layer insulation film on the second interlayer insulating film 646, the barrier film 647 is formed. Specifically, the insulating film which contains aluminum, such as nitride aluminum (AlN), a nitride aluminum oxide (AlNO), oxidization nitride aluminum (AlNO), nitride silicon (SiN), and nitride oxidization silicon (SiNO), or silicon, carbon nitride and DLC (diamond like carbon) may be used to form the barrier film to have a thickness of 0.2 to 1 μm. In this embodiment mode, the barrier film which consists of nitride silicon is formed to have a thickness of 0.3 μm by the sputtering method. In addition, as a sputtering method used here, there is the 2 pole sputtering method, an ion beam sputtering method, or the opposite target sputtering method.

Then, a contact hole that reaches each impurity region is formed. In this embodiment mode, a plurality of etching processes are sequentially performed. In this embodiment mode, the second interlayer insulting film is etched with the first interlayer insulating film as the etching stopper, the first interlayer insulating film is etched with the insulating film (not shown) as the etching stopper, and then, the insulating film (not shown) is etched.

Wirings 650 to 656 and the first electrode 657 to be an anode are formed that connect electrically with high concentration impurity regions 634, 635, 641, and 642 respectively.

In this embodiment mode, conductive materials having light blocking effect are used. Specifically, a conductive nitride, an oxide, a carbide, a boride, and a silicide that are composed of elements of fourth, fifth, or sixth group of the periodic system can be used. However, wirings 650 to 656 and the first electrode (anode) 657 are patterned to be formed having a thickness of 500 nm by using titanium nitride (TiN).

As the etching conditions of this embodiment mode, a mixed gas of $CF_4$ and $Cl_2$ is used as an etching gas, the gas flow rate is set to 40/40 sccm, and plasma is generated by applying a 450 W RF (13.56 MHZ) power to a coil shape electrode is under 1.2 Pa to thereby perform etching for about 30 seconds. A 100 W R (13.56 MHz) power is also applied to the substrate side (test piece stage) to effectively a negative self-bias voltage.

In this embodiment, the first electrode (anode) 657 is formed simultaneously with wiring formation, and to serve a function as a wiring of high concentration impurity region 642.

As described above, a driver circuit 705 having an n-channel TFT 701 and a p-channel TFT 702, and pixel portion 706 having a switching TFT 703 made from an n-channel TFT and a current control TFT 704 made from an n-channel TFT can be formed on the same substrate. (FIG. 12C) In this specification, the above substrate is called an active matrix substrate for the sake of convenience.

In the pixel portion 706, the switching TFT 703 (n-channel TFT) has a channel forming region 503, the first impurity region ($n^-$ region) 638 formed outside the conductive layer 623 forming the gate electrode, and the second impurity region ($n^+$ region) 635 functioning as a source or drain region.

In the pixel portion 706, the TFT for current control 704 ($p^-$ channel TFT) has a channel forming region 504, the fifth impurity region ($p^-$ region) 644 that overlaps a part of the conductive layer 624 forming the gate electrode through an insulating film, and the fourth impurity region ($p^+$ region) 642 functioning as a source or drain region.

Further, in the driver circuit 705, the n-channel TFT 701 has a channel forming region 501, the first impurity region ($n^-$ region) 637 that overlaps a part of the conductive layer 621 forming the gate electrode through the insulating film, and to the second impurity region ($n^+$ region) 634 functioning as a source region or a drain region.

Further, in the driver circuit 705, the p-channel TFT 702 has a channel forming region 502, the fifth impurity region ($p^-$ region) 643 that overlaps a part of the conductive layer 622 forming the gate electrode through the insulating film, and the fourth impurity region ($p^+$ region) 641 functioning as a source region or a drain region.

The above TFTs 701 and 702 are appropriately combined to form a shift register circuit, a buffer circuit, a level shifter circuit, a latch circuit and the like, thereby forming the driver circuit 705. For example, in the case where a CMOS circuit is formed, the n-channel TFT 701 and the p-channel TFT 702 may be complementarily connected to each other.

Moreover, the structure of the n-channel TFT 701, which is a GOLD (Gate-drain Overlapped LDD) structure that is formed by overlapping a LDD (Lightly Doped Drain) region with a gate electrode, is appropriate for the circuit in which the reliability takes top priority.

Note that the TFT (n-channel TFT and p-channel TFT) in the driver circuit 705 are required to have a high driving capacity (on current: Ion) and prevent deterioration due to a hot carrier effect to thereby improve reliability. A TFT having a region (GOLD region) where a gate electrode overlaps a low concentration impurity region through a gate insulating film is used as a structure effective in preventing deterioration of an on current value due to hot carriers.

Note that the switching TFT 703 in the pixel portion 706 require a low off current (Ioff). A structure having a region (LDD region) where a gate electrode does not overlap a low concentration impurity region through a gate insulating film is used as a TFT structure for reducing an off current.

Next, an insulating film is formed to have a thickness of 1 μm. As the insulating material containing silicon, silicon oxide, silicon nitride, or silicon oxide nitride may be used. As the organic resin, polyimide (including photosensitive polyimide), polyamide, acrylic (including photosensitive acrylic), BCB (benzocyclobutene), or the like may be used.

The opening portion is formed at the corresponding portion to the pixel electrode 657 of the insulating film to form the insulating film 658 (FIG. 13A).

In addition, an insulating film is formed using a photosensitive polyimide to have a thickness of 1 μm, and after conducting a patterning by photolithography method the insulating film 658 is formed by conducting an etching treatment.

On the exposed first electrode (anode) 657 in the opening portion of the insulating layer 658, an organic compound layer 659 is formed by evaporation method. (FIG. 13A) The organic compound layer 659 is formed by laminating same element structure as shown in Embodiment Mode 2.

Although only one pixel is shown here, one of the organic compound layer emitting three kinds of light, red, green, or blue is formed in each pixel formed in plural in the pixel portion. Thus, full-color display is realized. The combination of organic compounds forming organic compound layer that emits three kinds of light is described with reference to FIGS. 14A to 14D.

The light emitting element shown in FIG. 14A comprises a first electrode (anode) 1401, an organic compound layer 1402, and a second electrode (cathode) 1403. The organic compound layer 1402 has a lamination structure of a hole transporting layer 1404, a light emitting layer 1405, a blocking layer 1406, an electron transporting layer 1407, and an electron transmitting region 1408. In addition, materials and thickness of red luminescent light emitting element is shown in FIG. 14B, materials and thickness of green luminescent light emitting element is shown in FIG. 14C, and materials and thickness of blue luminescent light emitting element is shown in FIG. 14D.

First, an organic compound layer emitting red light is formed. Specifically, the α-NPD as a hole transporting organic compound is formed into the hole transporting layer 1404 in a 40 nm film thickness. A 2,3,7,8,12,13,17,18-octaethyl-21H, 23H-porphyrin-platinum (hereinafter referred to as the PtOEP) as a luminescent organic compound is co-deposited to form the light emitting layer 1405 with organic compounds (hereinafter referred to as the host materials) a 4,4'-dicarbazole-biphenyl (hereinafter referred to as the CBP) to serve as the host in a 30 nm film thickness. A basocuproin (hereinafter referred to as the BCP) as a blocking organic compound is formed into a blocking layer 1406 in a 10 nm film thickness. $Alq_3$ as an electron transporting organic compound is formed into an electron transporting layer 1407 in a 40 nm film thickness. An electron transmitting region 1408 is co-deposited to form a red luminescent organic compound layer with TMB and $Alq_3$ in a 5 nm film thickness.

Although the case of forming a red luminescent organic compound layer using 5 kinds of organic compounds with different functions is explained here, the present invention is not limited thereto, and known materials can be used as the organic compound showing the red luminescence.

A green luminescent organic compound layer is formed. Specifically, an α-NPD as a hole transporting organic compound is formed into the hole transporting layer 1404 in a 40 nm film thickness. The light emitting layer 1405 is formed by that a CBP used as a hole transmitting host material is co-deposited with a tris(2-phenyl pyridine) iridium ($Ir(ppy)_3$) in a 30 nm film thickness. A BCP as a blocking organic compound is formed into the blocking layer 1406 in a 10 nm film thickness. An $Alq_3$ as an electron transporting organic compound is formed into the electron transporting layer 1407 in a 40 nm film thickness. The electron transmitting region 1408 is co-deposited to form a green luminescent organic compound layer with TMB and $Alq_3$ in a 5 nm film thickness.

Although the case of forming a green luminescent organic compound layer using 4 kinds of organic compounds with different functions is explained here, the present invention is not limited thereto, and known materials can be used as the organic compound showing the green luminescence.

A blue luminescent organic compound layer is formed. Specifically, an α-NPD as a luminescent organic compound and a hole transporting organic compound is formed into the light emitting layer 1405 in a 40 nm film thickness. A BCP as a blocking organic compound is formed into the blocking layer 1406 in a 10 nm film thickness. An $Alq_3$ as an electron transporting organic compound is formed into the electron transporting layer 1407 in a 40 nm film thickness. The electron transmitting region 1408 is co-deposited to form a blue luminescent organic compound layer with TMB and $Alq_3$ in a 5 nm film thickness.

Although the case of forming a blue luminescent organic compound layer using 3 kinds of organic compounds with different functions is explained here, the present invention is not limited thereto, and known materials can be used as the organic compound showing the blue light emission.

By forming the above-mentioned organic compounds on the first electrode (anode), an organic compound layer emitting the red luminescence, the green luminescence and the blue luminescence can be formed in the pixel portion.

Next, as shown in FIG. 13B, the second electrode (cathode) 660 is formed by overlapping the organic compound layer 659 and the insulating layer 658. In this embodiment mode, the cathode 660 is formed by a conductive film that is transparent to the light. Specifically, it is preferable that the cathode is formed by small work function material in order to improve an electron injection. In this embodiment mode, the second electrode (cathode) 660 is made from aluminum or argentine.

In this embodiment mode, since the light generated at the light emitting element radiates through the second electrode (cathode) 660, the cathode needs to be a transparent to the light. Therefore, the second electrode (cathode) 660 is made from aluminum by forming to have a thickness of 20 nm.

Thus, the second electrode (cathode) 660 is formed by ultrathin film, thereby the electrode having light transparency can be formed. The second electrode (cathode) 660 can be formed by another known material only in cases in which the material is a small work function material and is a conductive film that is transparent to the light.

As shown in FIG. 13B, an element substrate having the first electrode (anode) 657 connected electrically to the current control TFT 704, the insulating layer 658 formed between the first electrode (anode) 657 and the electrode that is adjacent to the first electrode (anode) 657 (not illustrated), the organic compound layer 659 formed on the first electrode (anode) 657, and the light emitting element 661 made from the second electrode (cathode) 660 formed on the organic compound layer 659 and the insulating layer 658 can be formed.

In this embodiment, the driving voltage of a TFT is 1.2 to 10 V, preferably 2.5 to 5.5 V.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which light emitting elements emit light (also called a character display), and a background is displayed by pixels in which light emitting elements do not emit light (also called a background display).

Figure 15A:
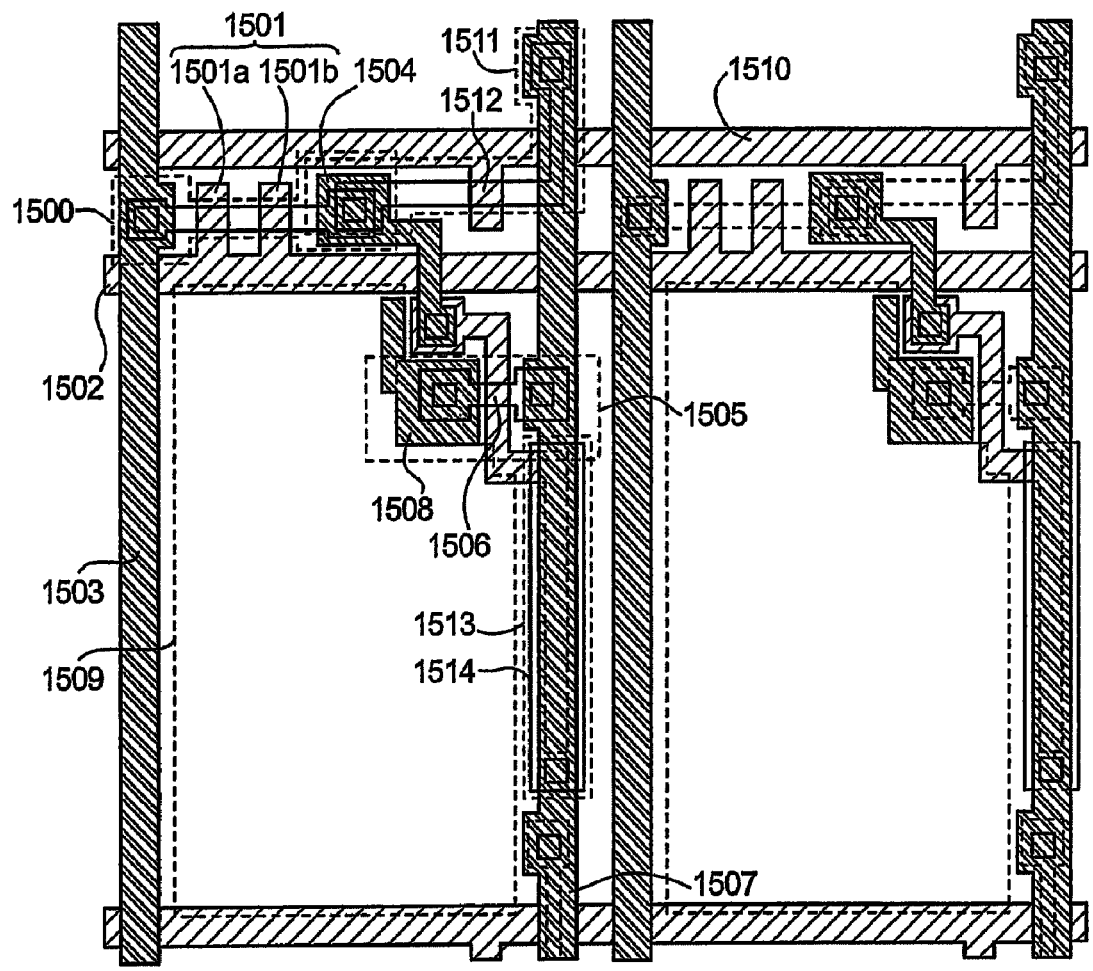
FIGS. 15A and 15B are diagrams for explaining a circuit structure capable of using the present invention.
Figure 15B:
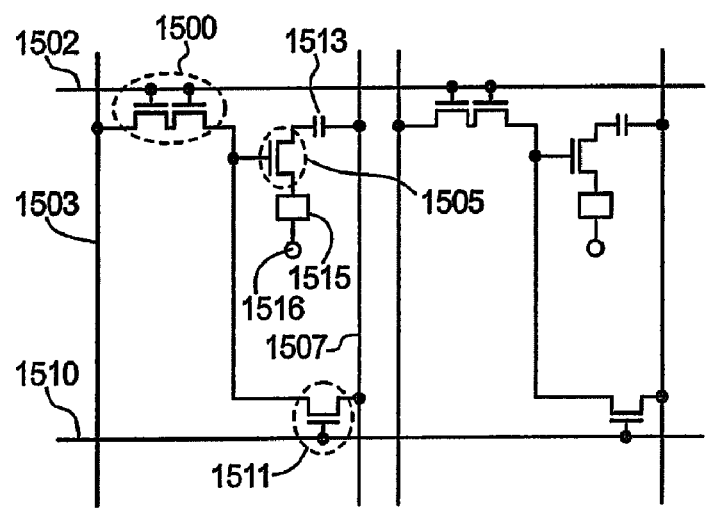

A detailed top surface structure of a pixel portion is shown in FIG. 15A, and a circuit diagram thereof is shown in FIG. 15B. FIGS. 15A and 15B denoted by a same reference numerals.

In FIGS. 15A and 15B, a switching TFT 1500 provided on a substrate is formed by using the switching TFT (n-channel type) TFT 703 of FIG. 13. Therefore, an explanation of the switching (n-channel type) TFT 703 may be referred for an explanation of the structure. Further, a wiring indicated by reference numeral 1502 is a gate wiring for electrically connecting with gate electrodes 1501 (1501a and 1501b) of the switching TFT 1500.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 1500 is connected to a source wiring 1503, and a drain thereof is connected to a drain wiring 1504. The drain wiring 1504 is electrically connected with a gate electrode 1506 of a current control TFT 1505. Note that the current control TFT 1505 is formed by using the current control (n-channel type) TFT 704 of FIG. 13. Therefore, an explanation of the current control (n-channel type) TFT 704 may be referred for an explanation of the structure. Note that, although the single gate structure is adopted in this embodiment, the double gate structure or the triple gate structure may also be adopted.

Further, a source of the current control TFT 1505 is electrically connected with a current supply line 1507, and a drain thereof is electrically connected with a drain wiring 1508. Besides, the drain wiring 1508 is electrically connected with the first electrode (cathode) 1509 indicated by a dotted line.

A wiring indicated by reference numeral 1510 is a gate wiring connected with the gate electrode 1512 of the erasing TFT 1511. Further, a source of the erasing TFT 1511 is electrically connected to the current supply line 1507, and a drain thereof is electrically connected to the drain wiring 1504.

The erasing TFT 1511 is formed like a current control TFT (n-channel type) 704 in FIG. 13. Therefore, an explanation of the structure is referred to that of the current control TFT (n-channel type) 704. In this embodiment, a single gate structure is described though, a double gate structure or a triple gate structure can be used.

At this time, a storage capacitor (condenser) is formed in a region indicated by reference numeral 1513. The capacitor 1513 is formed by a semiconductor film 1514 electrically connected with the current supply line 1507, an insulating film (not shown) of the same layer as a gate insulating film, and the gate electrode 1506. Further, a capacitor formed by the gate electrode 1506, the same layer (not shown) as a first interlayer insulating film, and the current supply line 1507 may be used as a storage capacitor.

The light emitting element 1515 shown in circuit diagram in FIG. 15B is composed of the cathode 1509, an organic compound layer (not illustrated) formed on the cathode 1509, and an anode (not illustrated) formed on the organic compound layer. In the present invention, the cathode 1509 is connected with a source region and a drain region of the current control TFT 1505.

A counter potential is supplied to the anode of the light emitting element 1515. In addition, the power source potential is supplied to the power supply line V. A potential difference between the counter potential and the power source potential is always maintained at such a level that causes the light emitting element to emit light when the power source potential is applied to the pixel electrode. The power source potential and the counter potential are supplied to the light emitting device of the present invention by means of a power source provided by an externally-attached IC chip or the like. In the present specification, the power source supplying a counter potential is referred to as the counter power source 1516.

Embodiment Mode 7

Referring to FIGS. 16A and 16B, the external appearance of an active-matrix type light-emitting device of the present invention will be described in the embodiment mode. FIG. 16A is a top view of the luminescent device, and FIG. 16B is a sectional view taken on line A-A' of FIG. 16A. Shown by dotted lines, reference numeral 1601 represents a source signal line driving circuit, 1602, a pixel portion; and 1603, a gate signal line driving circuit; 1604, a sealing substrate; and 1605, a sealing agent. A space is surrounded by the sealing agent 1605.

Reference number 1608 represents an interconnection for transmitting signals inputted to the source signal line driving circuit 1601 and the gate signal line driving circuit 1603. The interconnection 1608 receives video signals or clock signals from a flexible print circuit (FPC) 1609, which will be an external input terminal. Only the FPC is illustrated, but a printed wiring board (PWB) may be attached to this FPC. The light-emitting device referred to in the present specification may be the body of the light-emitting device, or a product wherein an FPC or a PWB is attached to the body.

The following will describe a sectional structure, referring to FIG. 16B. The driving circuits and the pixel section are formed on the substrate 1610, but the source signal line driving circuit 1601 as one of the driving circuits and the pixel section 1002 are shown in FIG. 16B.

In the source signal line driving circuit 1601, a CMOS circuit wherein an n-channel type TFT 1623 and a p-channel type TFT 1624 are combined is formed. The TFTs constituting the driving circuit may be composed of known CMOS circuits, PMOS circuits or NMOS circuits. In this embodiment mode, a driver-integrated type, wherein the driving circuit is formed on the substrate, is illustrated, but the driver-integrated type may not necessarily be adopted. The driver may be fitted not to the substrate but to the outside.

The pixel portion 1602 is composed of a plurality of pixels each of which includes a current control TFT 1611 and the first electrode 1612. The first electrode 1612 is electrically connected to a drain of the current control TFT 1611.

An insulating layer 1613 is formed on each end of the first electrode 1612. An organic compound layer composed of a first organic compound layer 1614 is formed on the first electrode 1612. The second electrode 1616 is formed on the organic compound layer 1614. Thus completed is a light-emitting element 1618 composed of the first electrode 1612, the organic compound layer 1614, and the second electrode 1616.

The second electrode 1616 also functions as a common wiring line shared by all the pixels and is electrically connected to the FPC 1609 through the connection wiring line 1608.

The sealing substrate 1604 is bonded to the substrate 1610 with the sealing agent 1605 in order to seal the light-emitting element 1618 formed over the substrate 1610. Spacers formed from a resin film may be provided to keep the distance between the sealing substrate 1604 and the light-emitting element 1618. The space 1607 inside the sealing agent 1605 is filled with inert gas such as nitrogen. The sealing agent 1605 is preferably an epoxy resin. Desirably, the material of the sealing agent 1605 is one that allows as little moisture and oxygen as possible to transmit. A hygroscopic substance or an anti-oxidizing substance may be placed in the space 1607.

In this embodiment, a glass substrate or a quartz substrate is used as the sealing substrate 1604. Alternatively, the cover member may be a plastic substrate that is formed of FRP (fiberglass-reinforced plastics), PVF (polyvinyl fluoride), Mylar, polyester, acrylic, or the like. After the sealing substrate 1604 is bonded to the substrate 1610 using the sealing agent 1605, the side faces (exposed faces) of the device may be further covered and sealed by the sealing agent.

By sealing the light-emitting element in the space 1607 as described above, the light-emitting element is completely shut off from the outside and external substances that accelerate degradation of the organic compound layer, such as moisture and oxygen, can be prevented from entering the light-emitting element. Therefore, a highly reliable light-emitting device can be obtained.

The structure of this embodiment may be freely combined with any of the structures of Embodiment Modes 1 to 6.

Embodiment Mode 8

Figure 17:
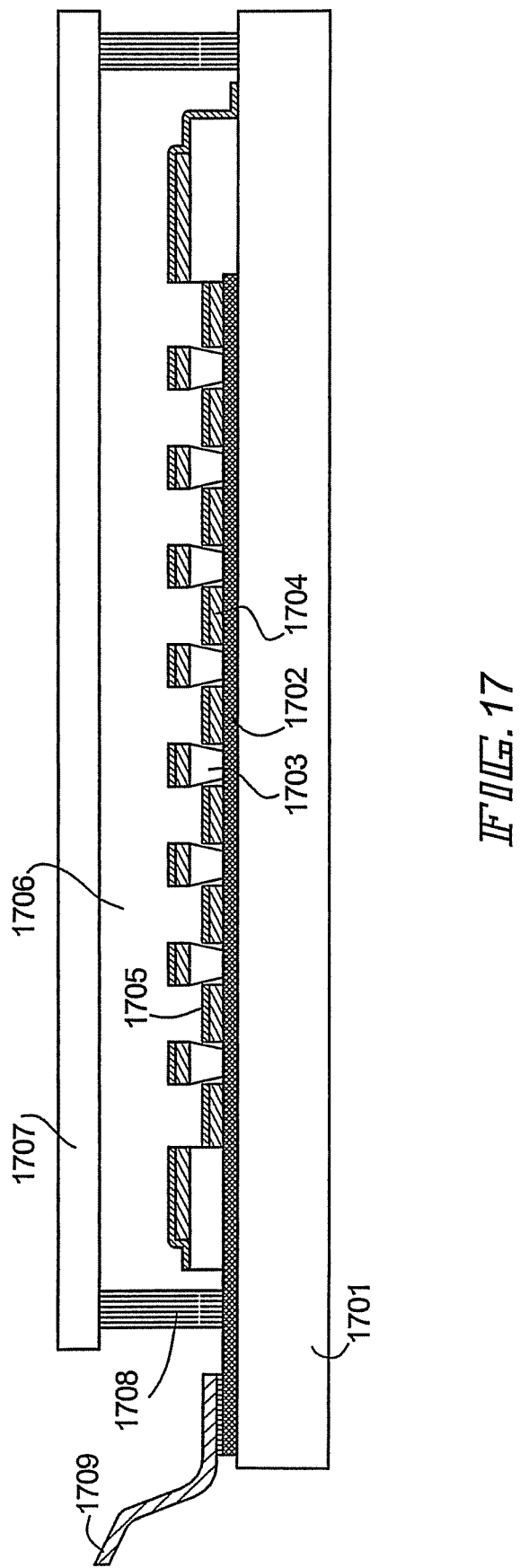
FIG. 17 is a diagram for explaining a passive matrix light emitting device.

In this embodiment, a case in which a passive type (simple matrix type) light emitting device having an element structure of the present invention is manufactured is described with reference to FIG. 17. In FIG. 17, reference numbers 1701 and 1702 represent a glass substrate and the first electrode (anode) made of a metal compound film, respectively. In this embodiment, TiN is formed by sputtering as metal compounds. Not shown in FIG. 17, plural anodes are arranged in the stripe form in parallel with the paper. In the passive matrix light emitting device, since the anode material is required higher conductivity than active matrix light emitting device, it is effective that higher conductive metal compounds than ITO that is used conventionally is used for the anode in reducing the driving voltage of the light emitting element.

Banks 1703 made of an insulating material are formed to cross the first electrode (anode) 1702 arranged in the stripe form. The banks 1703 are formed perpendicularly to the paper face to contact the first electrode (anode) 1702.

Next, a layer comprising at least one organic compound 1704 is formed. As the material which makes the layer comprising at least one organic compound 1704, a known material which can give luminescence, as well as the materials described in this specification can be used.

For example, by forming a layer comprising at least one organic compound giving red luminescence, a layer comprising at least one organic compound giving green luminescence, and a layer comprising at least one organic compound giving blue luminescence, a light emitting device giving three types of luminescence rays can be formed. Since the layer comprising at least one organic compound 1704 composed of these layers is formed along grooves made in the banks 1703, the layer 1704 is arranged in the stripe form perpendicular to the paper face.

Next, the second electrode (cathode) 1705 is formed on the organic compound layer 1704. The second electrode (cathode) 1705 is formed by vapor deposition using a metal mask.

Since the lower first electrode (anode) 1702 is made from transparent materials in this embodiment mode, light generated at the layer comprising at least one organic compound layer 1704 is radiated upward from second electrode (cathode) 1705.

Next, a glass substrate is prepared as a sealing substrate 1707. Since the sealing substrate 1707 may have transparency in the structure of this embodiment, a substrate made of plastic or quartz may be used as well as glass substrate.

The sealing substrate 1707 is adhered to the substrate 1701 with a sealant 1708 made of an ultraviolet hardening resin. The inside 1706 of the sealant 1708 is an airtightly-closed space, and the inside is filled with an inert gas such as nitrogen or argon. It is effective to put a moisture absorbent, a typical example of which is barium oxide, in the airtightly closed space 1706. At last, a flexible printed circuit (FPC) 1709 is fitted to the anodes to complete a passive type light emitting device.

This embodiment mode may be carried out by combining except structures relevant to the element structure (active matrix type) shown in Embodiment Modes 1 to 7.

Embodiment Mode 9

Being self-luminous, a light emitting device using a light emitting element has better visibility in bright places and wider viewing angle than liquid crystal display devices. Therefore, various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices is with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 18A to 18H.

Figure 18A:
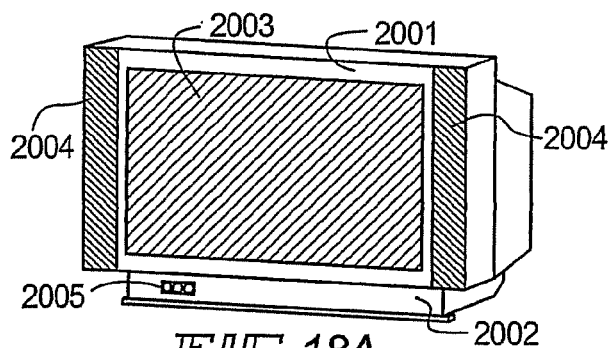
FIGS. 18A to 18H are diagrams showing examples of electronic equipment.

FIG. 18A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 18B:
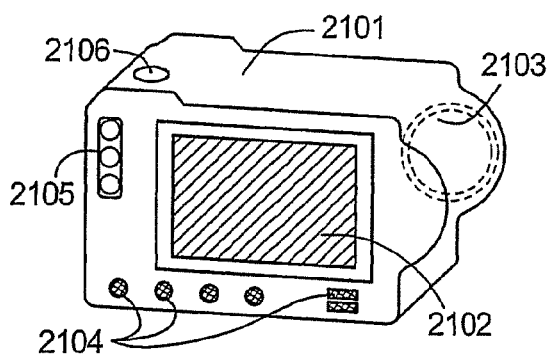

FIG. 18B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 18C:
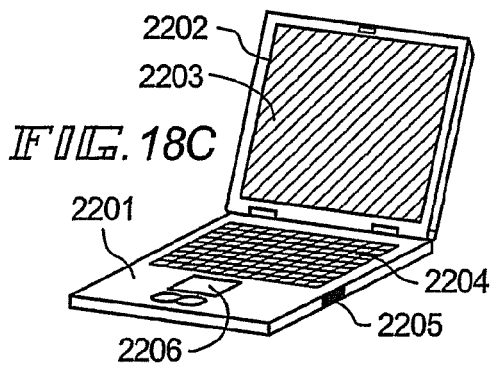

FIG. 18C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 18D:
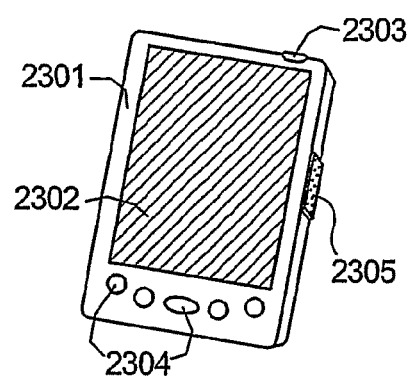

FIG. 18D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

FIG. 18D shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 18E:
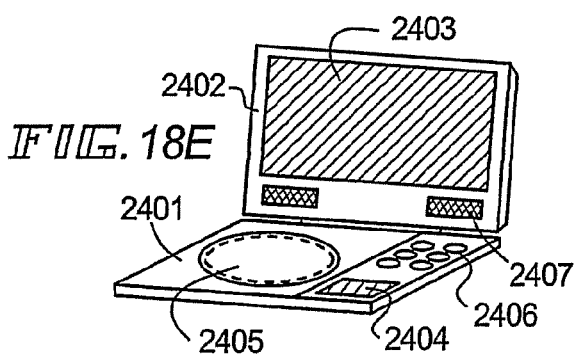
Figure 18F:
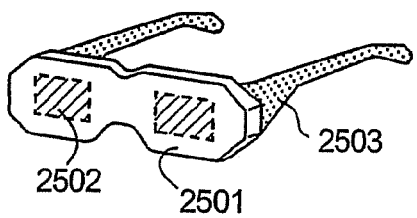
Figure 18G:
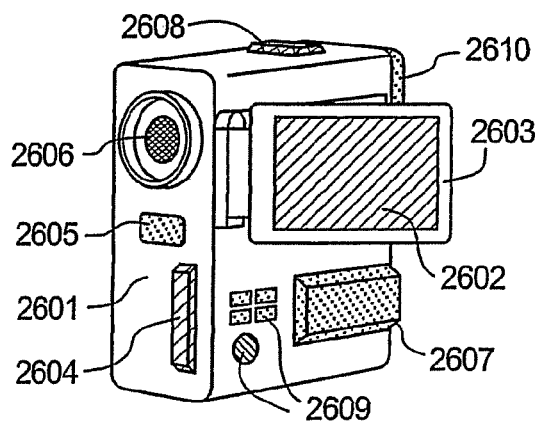
Figure 18H:
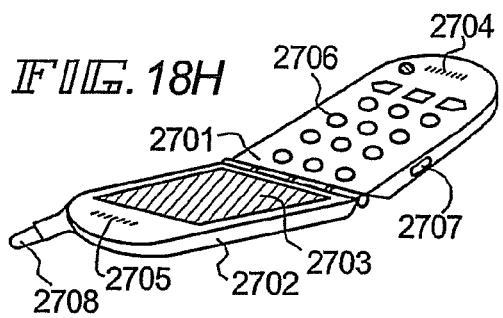

FIG. 18F shows a goggle type display (head mounted display), which is composed of a main body 2501, display units 2502, and arm units 2503. The light emitting device manufactured in accordance with the present invention can be applied to the display units 2502.

FIG. 16G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

FIG. 16H shows a portable telephone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can be completed by using the light emitting device formed by implementing Embodiment Modes 1 to 8.

Embodiment Mode 10

Figure 19:
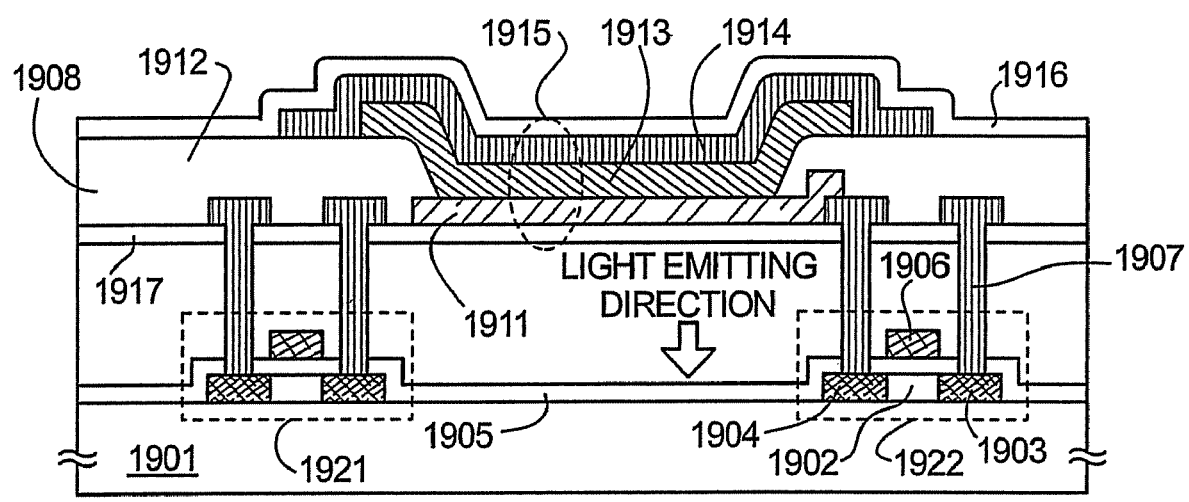
FIG. 19 is a diagram for explaining the element structure of the light emitting device of the present invention.

In addition, it is also possible for the light emitting device of the present invention to be given the structure shown in FIG. 19. Note that FIG. 19 is used in explaining a case of a structure in which a first electrode 1911 is an anode, a second electrode 1914 is a cathode, and light passes through from the first electrode 1911 side, as explained in Embodiment Mode 4. Reference numeral 1901 denotes a substrate, 1902 denotes a channel formation region, 1903 denotes a source region, 1904 denotes a drain region, 1905 denotes a gate insulating film, 1906 denotes a gate electrode, 1908 denotes an interlayer insulating film, 1921 denotes a switching TFT, 1922 denotes a current control TFT, and 1917 denotes a barrier film.

Materials such as an inorganic material (silicon oxide, silicon nitride, silicon oxynitride, or the like), a photosensitive or non-photosensitive organic material (polyimide, acrylic, polyamide, polyimide amide, resist, or benzocyclobutene), a laminate of these materials can be used as an insulating layer 1912 (referred to as bank, partition, barrier, and the like) covering an edge portion of the first electrode (anode) 1911 (and a wiring 1907). For example, it is preferable that the radius of curvature in an edge portion of the insulating film be set to 0.2 to 2 μm as shown in FIG. 19 for a case of using a positive type photosensitive acrylic as an organic resin material, and that a curved surface having an angle with the contact surface equal to or greater than 35 be provided.

Furthermore, an organic compound layer 1913 is an extremely thin film, and therefore it is preferable that the surface of the first electrode 1911 be leveled. For example, leveling may be performed by chemically or mechanically polishing (typically a CMP technique), or another process either before or after patterning of the first electrode 1911. Further, cleaning (brush cleaning or sponge cleaning) is performed in order to remove foreign substances (such as refuse) before and after formation of the insulating layer 1912 in order to increase the cleanliness of the surface of the first electrode 1911. The generation of dark spots and point defects is thus reduced.

In addition to the materials shown in previous embodiment modes, materials emitting a white light can also be used in the organic compound layer 1913 of a light emitting element 1915. In this case, Alq$_3$, Alq$_3$ into which the red color pigment nile red is partially doped, Alq$_3$, p-EtTAZ, and TPD (aromatic diamine) may be laminated in order from the first electrode (anode) 1911 by using evaporation. Note that R (red), G (green), and B (blue) color lights can also be obtained when using white color luminescence by combining color filters in the structure.

Further, the second electrode (cathode) 1914 is formed on the organic compound layer 1913, and evaporation (resistance heating) and sputtering can be used as film formation methods, The light emitting element 1915 made from the first electrode (anode) 1911, the organic compound layer 1913, and the second electrode (cathode) 1914 can thus be formed.

In addition, a passivation film 1916 can also be formed on the second electrode (cathode) 1914 of the light emitting element 1915 by using a material having insulating characteristics. Note that in addition to a silicon nitride film formed by sputtering using Si as a target, a laminate film in which a hygroscopic material is sandwiched by a silicon nitride film can also be used as the passivation film 1916 material. In addition, it is also possible to use a DLC film (diamond like carbon film), carbon nitride (CxNy), and the like.

The present invention can improve the characteristics of a light emitting element, without imparting adverse influence to TFT characteristics in an active matrix light emitting device having TFTs. This is because donor levels positioned in intermediate LUMO levels between a cathode and an organic compound layer are formed, and the transmission of electrons injected from the cathode can be performed with good efficiency by forming an electron transmitting region containing donor molecules in a portion of the organic compound layer, and by forming the electron transmitting region so that it contacts the cathode.

In addition, energy generated due to carrier recombination in a light emitting layer is transferred to an electric charge transfer complex developing in the electron to transmitting region containing the donor molecules, and extinguishing of light of the light emitting elements can be prevented and degradation in the light emission efficiency can be prevented by forming the electron transmitting region such that it does not contact the light emitting layer contained in the organic compound layer.

What is claimed is:

1. A light emitting device comprising:
   a first electrode over a substrate;
   a hole transporting layer on the first electrode;
   a light emitting layer on the hole transporting layer;
   an electron transporting layer comprising a material having electron transporting characteristics over the light emitting layer; and
   a second electrode on the electron transporting layer,
   wherein at least a portion of the electron transporting layer is an electron transmitting region, the electron transmitting region comprising donor molecules,
   wherein the electron transmitting region is in contact with the second electrode and is not in contact with the light emitting layer,
   wherein at least a portion of the hole transporting layer is a hole transmitting region, the hole transmitting region comprising acceptor molecules, and
   wherein the light emitting layer includes triplet light emission materials.

2. A light emitting device according to claim 1, wherein the first electrode is an anode and the second electrode is a cathode.

3. A light emitting device according to claim 1, further comprising a TFT having a source region and a drain region formed over the substrate.

4. A light emitting device according to claim 3, wherein the first electrode is electrically connected to one of the source region and the drain region.

5. A light emitting device according to claim 1, wherein the donor molecule is 3,3',5,5'-tetramethylbenzidine.

6. A light emitting device according to claim 1, wherein the light emitting device is incorporated in at least one selected from the group consisting of a display device, a digital camera, a personal computer, a mobile computer, a portable image playback device prepared with a recording medium, a goggle type display, a video camera and a portable telephone.

7. A light emitting device according to claim 1, wherein the donor molecules contain an organic compound.

8. A light emitting device according to claim 1, wherein the donor molecules contain tetrathiotetracene and the material having electron transporting characteristics contains $Alq_3$.

9. A light emitting device according to claim 1, wherein the electron transmitting region comprises the material having electron transporting characteristics.

10. A light emitting device according to claim 1, wherein the second electrode is light transmitting.

11. A light emitting device according to claim 1, wherein the hole transmitting region is in contact with the first electrode and is not in contact with the light emitting layer.

12. A light emitting device comprising:
    a first electrode over a substrate;
    a hole transporting layer on the first electrode;
    a light emitting layer on the hole transporting layer,
    an electron transporting layer comprising a material having electron transporting characteristics over the light emitting layer; and
    a second electrode on the electron transporting layer,
    wherein at least a portion of the electron transporting layer includes a region which comprises donor molecules,
    wherein the region which comprises donor molecules is in contact with the second electrode and is not in contact with the light emitting layer,
    wherein at least a portion of the hole transporting layer includes a region which comprises acceptor molecules, and
    wherein the light emitting layer includes triplet light emission materials.

13. A light emitting device according to claim 12, wherein the first electrode is an anode and the second electrode is a cathode.

14. A light emitting device according to claim 12, further comprising a TFT having a source region and a drain region formed over the substrate.

15. A light emitting device according to claim 14, wherein the first electrode is electrically connected to one of the source region and the drain region.

16. A light emitting device according to claim 12, wherein the donor molecule is 3,3',5,5'-tetramethylbenzidine.

17. A light emitting device according to claim 12, wherein the light emitting device is incorporated in at least one selected from the group consisting of a display device, a digital camera, a personal computer, a mobile computer, a portable image playback device prepared with a recording medium, a goggle type display, a video camera and a portable telephone.

18. A light emitting device according to claim 12, wherein the donor molecules contain an organic compound.

19. A light emitting device according to claim 12, wherein the donor molecules contain tetrathiotetracene and the material having electron transporting characteristics contains $Alq_3$.

20. A light emitting device according to claim 12, wherein the second electrode is light transmitting.

21. A light emitting device according to claim 12, wherein the region which comprises acceptor molecules is in contact with the first electrode and is not in contact with the light emitting layer.

22. A light emitting device comprising:
    a first electrode over a substrate;
    a hole transporting layer on the first electrode;
    a light emitting layer on the hole transporting layer;

an electron transporting layer comprising a material having electron transporting characteristics over the light emitting layer; and a second electrode on the electron transporting layer, wherein at least a portion of the electron transporting layer is an electron transmitting region, the electron transmitting region comprising donor molecules, wherein the electron transmitting region is in contact with the second electrode and is not in contact with the light emitting layer, wherein at least a portion of the hole transporting layer is a hole transmitting region, the hole transmitting region comprising acceptor molecules.

* * * * *

UNITED STATES PATENT AND TRADEMARK OFFICE
CERTIFICATE OF CORRECTION

| | |
|---|---|
| PATENT NO. | : 7,868,324 B2 |
| APPLICATION NO. | : 12/111586 |
| DATED | : January 11, 2011 |
| INVENTOR(S) | : Takeshi Nishi and Satoshi Seo |

It is certified that error appears in the above-identified patent and that said Letters Patent is hereby corrected as shown below:

Column 2, Line 56, Delete "to";

Column 7, Line 62, Delete "is";

Column 12, Line 45, Change "phthalocyanine" to -- phthalocyamine --;

Column 12, Line 46, Change "phthalocyanine" to -- phthalocyamine --;

Column 12, Line 56, Delete "p-EtTAZ" (first occurrence);

Column 13, Line 11, Change "functions" to -- function --;

Column 15, Line 32, Change "devices" to -- device --;

Column 15, Line 42, Delete "to" (second occurrence);

Column 16, Line 43, Change "phthalocyanine" to -- phthalocyamine --;

Column 21, Line 52, Delete "is";

Column 23, Line 45, Change "µm" to -- nm --;

Column 25, Line 43, Change "$Si_xG_{1x}$" to -- $Si_xGe_{1-x}$ --;

Column 29, Line 6, Change "227.3 n/min" to -- 227.3 nm/min --;

Column 29, Line 20, Change "615a" to -- 618a --;

Column 29, Line 27, Delete "is";

Column 29, Line 47, Change "Mhz" to -- MHz --;

Column 29, Lines 53-54, Change "FIG. 1A" to -- FIG. 11A --;

Signed and Sealed this
Eighth Day of November, 2011

David J. Kappos
*Director of the United States Patent and Trademark Office*

CERTIFICATE OF CORRECTION (continued)

U.S. Pat. No. 7,868,324 B2

Column 30, Line 30, After "$1 \times 10^{18}$ to" Insert -- $1 \times$ --;

Column 32, Line 12, Delete "is";

Column 32, Line 13, Change "R" to -- RF --;

Column 32, Line 42, Delete "to";

Column 38, Line 48, Delete "is";

Column 39, Line 18, Change "FIG. 18D" to -- FIG. 18E --;

Column 41, Line 23, Delete "to".